(12) United States Patent
Chikuma et al.

(10) Patent No.: US 11,688,560 B2
(45) Date of Patent: Jun. 27, 2023

(54) SUPPORTING-TERMINAL-EQUIPPED CAPACITOR CHIP

(71) Applicant: Murata Manufacturing Co., Ltd., Nagaokakyo (JP)

(72) Inventors: Shinobu Chikuma, Nagaokakyo (JP); Tadateru Yamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 133 days.

(21) Appl. No.: 17/075,745

(22) Filed: Oct. 21, 2020

(65) Prior Publication Data

US 2021/0125785 A1 Apr. 29, 2021

(30) Foreign Application Priority Data

Oct. 28, 2019 (JP) ................................. 2019-195046

(51) Int. Cl.
| | |
|---|---|
| *H01G 4/30* | (2006.01) |
| *H01G 4/012* | (2006.01) |
| *H01G 2/06* | (2006.01) |
| *H01G 4/12* | (2006.01) |
| *H01G 4/008* | (2006.01) |
| *H01G 4/232* | (2006.01) |

(52) U.S. Cl.
CPC ............. *H01G 4/30* (2013.01); *H01G 2/065* (2013.01); *H01G 4/008* (2013.01); *H01G 4/012* (2013.01); *H01G 4/1218* (2013.01); *H01G 4/232* (2013.01)

(58) Field of Classification Search
CPC .......... H01G 4/224; H01G 4/248; H01G 4/30; H01G 4/38; H01G 4/012; H01G 4/1227; H01G 4/1245; H01G 4/065; H01G 4/0085; H01G 4/40; H01G 4/12; H01G 4/1218; H05K 1/0231
See application file for complete search history.

(56) References Cited

U.S. PATENT DOCUMENTS

| | | | | |
|---|---|---|---|---|
| 2004/0183147 | A1* | 9/2004 | Togashi ............... | H05K 3/3426 257/414 |
| 2010/0188798 | A1* | 7/2010 | Togashi ............... | H05K 3/3426 361/306.3 |
| 2014/0240081 | A1* | 8/2014 | Murowaki ........... | H01H 85/201 337/208 |
| 2015/0014038 | A1* | 1/2015 | Park ...................... | H01G 4/248 361/301.4 |
| 2016/0086730 | A1* | 3/2016 | Park ...................... | H05K 3/3426 361/306.3 |

(Continued)

FOREIGN PATENT DOCUMENTS

JP 2015-019037 A 1/2015

*Primary Examiner* — Michael P McFadden
(74) *Attorney, Agent, or Firm* — Keating & Bennett, LLP

(57) ABSTRACT

A supporting-terminal-equipped capacitor chip includes a capacitor chip, and first and second supporting terminals that are electrically conductive and hold the capacitor chip therebetween. A portion of the capacitor chip other than a first connection portion and the first supporting terminal are separated from each other. A portion of the capacitor chip other than a second connection portion and the second supporting terminal are separated from each other. The first connection portion is located on the first main surface adjacent to a first end surface. The second connection portion is located on the first main surface adjacent to a second end surface.

20 Claims, 13 Drawing Sheets

(56) References Cited

U.S. PATENT DOCUMENTS

| | | | |
|---|---|---|---|
| 2016/0086734 A1* | 3/2016 | Park | H01G 4/0085 |
| | | | 361/301.4 |
| 2016/0126015 A1* | 5/2016 | Park | H01G 4/12 |
| | | | 361/301.4 |
| 2016/0219739 A1* | 7/2016 | Park | H01G 4/30 |
| 2016/0343506 A1* | 11/2016 | Lee | H01G 2/065 |
| 2017/0164479 A1* | 6/2017 | Park | H01G 2/065 |
| 2018/0122578 A1* | 5/2018 | Choi | H01G 4/232 |

* cited by examiner

SUPPORTING-TERMINAL-EQUIPPED CAPACITOR CHIP

CROSS REFERENCE TO RELATED APPLICATIONS

This application claims the benefit of priority to Japanese Patent Application No. 2019-195046 filed on Oct. 28, 2019. The entire contents of this application are hereby incorporated herein by reference.

BACKGROUND OF THE INVENTION

1. Field of the Invention

The present invention relates to a supporting-terminal-equipped capacitor chip.

2. Description of the Related Art

As a prior art document, Japanese Patent Laid-Open No. 2015-19037 discloses a multilayer ceramic capacitor including terminal frames. The multilayer ceramic capacitor described in Japanese Patent Laid-Open No. 2015-19037 includes a ceramic body, a plurality of first and second inner electrodes, first and second outer electrodes, and first and second terminal frames.

The ceramic body is formed by layering a plurality of dielectric layers in a width direction. The plurality of first and second inner electrodes are disposed to face each other with a dielectric layer being interposed therebetween in the ceramic body. Each of the plurality of first and second inner electrodes has a lead portion exposed through an upper surface of the ceramic body. The first and second outer electrodes are formed on the upper surface of the ceramic body and are coupled to the respective lead portions.

Each of the first and second terminal frames includes a vertical portion facing an end surface of the ceramic body; and upper and lower horizontal portions respectively facing the upper and lower surfaces. The upper horizontal portions of the first and second terminal frames are connected to the first and second outer electrodes, respectively. An adhesive layer is provided between the upper horizontal portion and the first outer electrode, and an adhesive layer is provided between the upper horizontal portion and the second outer electrode.

In the multilayer ceramic capacitor described in Japanese Patent Laid-Open No. 2015-19037, the first and second outer electrodes are connected to the first and second terminal frames with the adhesive layers being interposed therebetween, at positions at which the capacitor chip is greatly displaced due to a piezoelectric phenomenon. Thus, vibration of the capacitor chip generated due to the piezoelectric phenomenon is likely to be transferred to a circuit board. There is room for further reduction of acoustic noise.

SUMMARY OF THE INVENTION

Preferred embodiments of the present invention provide supporting-terminal-equipped capacitor chips in each of which vibration of a capacitor chip generated due to a piezoelectric phenomenon is less likely to be transferred to a circuit board to thus reduce acoustic noise.

A supporting-terminal-equipped capacitor chip according to a preferred embodiment of the present invention includes a capacitor chip; and a first supporting terminal and a second supporting terminal that hold the capacitor chip between the first supporting terminal and the second supporting terminal, the first supporting terminal and the second supporting terminal being electrically conductive. The capacitor chip includes a multilayer body, a first outer electrode, and a second outer electrode. The multilayer body includes a plurality of dielectric layers and a plurality of inner electrode layers alternately layered along a layering direction. The multilayer body includes a first main surface and a second main surface facing each other in the layering direction; a first side surface and a second side surface facing each other in a width direction orthogonal or substantially orthogonal to the layering direction; and a first end surface and a second end surface facing each other in a length direction orthogonal or substantially orthogonal to both the layering direction and the width direction. The first outer electrode extends from the first end surface onto a portion of each of the first main surface and the second main surface adjacent to the first end surface. The second outer electrode extends from the second end surface onto a portion of each of the first main surface and the second main surface adjacent to the second end surface. The plurality of inner electrode layers include a first inner electrode layer connected to the first outer electrode and a second inner electrode layer connected to the second outer electrode. The first supporting terminal is connected to a first connection portion of the first outer electrode on the first main surface. The second supporting terminal is connected to a second connection portion of the second outer electrode on the first main surface. A portion of the capacitor chip other than the first connection portion and the first supporting terminal are separated from each other. A portion of the capacitor chip other than the second connection portion and the second supporting terminal are separated from each other. The first connection portion is located on the first main surface adjacent to the first end surface. The second connection portion is located on the first main surface adjacent to the second end surface.

A supporting-terminal-equipped capacitor chip according to a preferred embodiment of the present invention includes a capacitor chip; and a first supporting terminal and a second supporting terminal that holds the capacitor chip between the first supporting terminal and the second supporting terminal, the first supporting terminal and the second supporting terminal being electrically conductive. The capacitor chip includes a multilayer body, a first outer electrode, and a second outer electrode. The multilayer body includes a plurality of dielectric layers and a plurality of inner electrode layers alternately layered along a layering direction. The multilayer body includes a first main surface and a second main surface facing each other in the layering direction; a first side surface and a second side surface facing each other in a width direction orthogonal or substantially orthogonal to the layering direction; and a first end surface and a second end surface facing each other in a length direction orthogonal or substantially orthogonal to both the layering direction and the width direction. The first outer electrode extends from the first end surface onto a portion of each of the first side surface and the second side surface adjacent to the first end surface. The second outer electrode extends from the second end surface onto a portion of each of the first side surface and the second side surface adjacent to the second end surface. The plurality of inner electrode layers include a first inner electrode layer connected to the first outer electrode and a second inner electrode layer connected to the second outer electrode. The first supporting terminal is connected to a first connection portion of the first outer electrode on the first side surface. The second supporting terminal is connected to a second connection portion of the second outer electrode on the first side surface. A portion of the capacitor chip other than the first connection portion and the first supporting terminal are separated from each other. A portion of the capacitor chip other than the second connection portion and the second supporting terminal are separated from each other. The first connection portion is located on the first side surface adjacent to at least one of the first main surface and the second main surface. The second connection portion is located on the first side surface adjacent to at least one of the first main surface and the second main surface.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
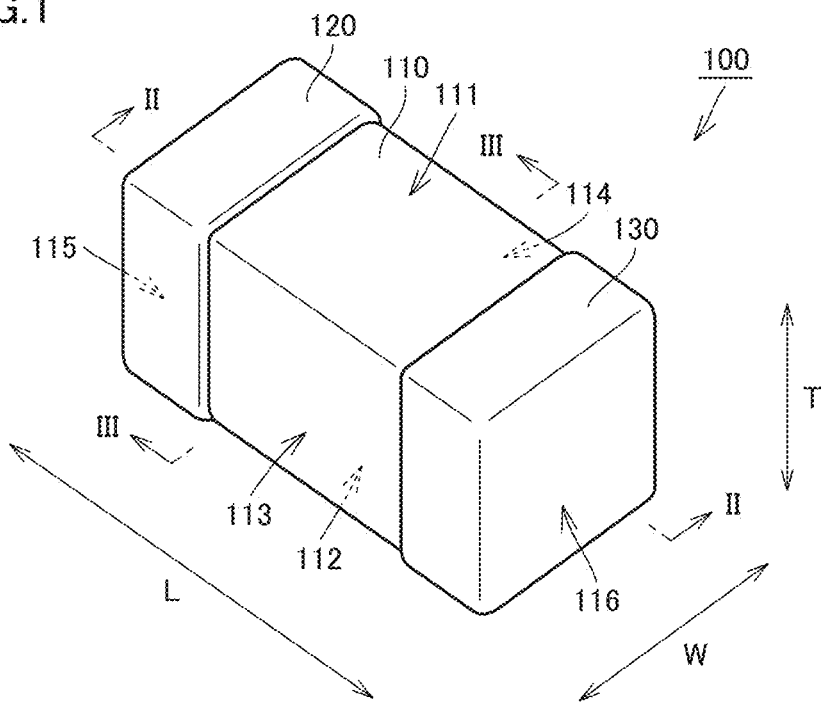
FIG. 1 is a perspective view showing a capacitor chip included in a supporting-terminal-equipped capacitor chip according to a first preferred embodiment of the present invention.

Hereinafter, supporting-terminal-equipped capacitor chips according to preferred embodiments of the present invention will be described with reference to the drawings. In the description of the preferred embodiments below, the same or corresponding portions in the drawings are denoted by the same reference characters and will not be described repeatedly.

First Preferred Embodiment

First, a capacitor chip included in a supporting-terminal-equipped capacitor chip according to a first preferred embodiment of the present invention will be described with reference to figures.

Figure 2:
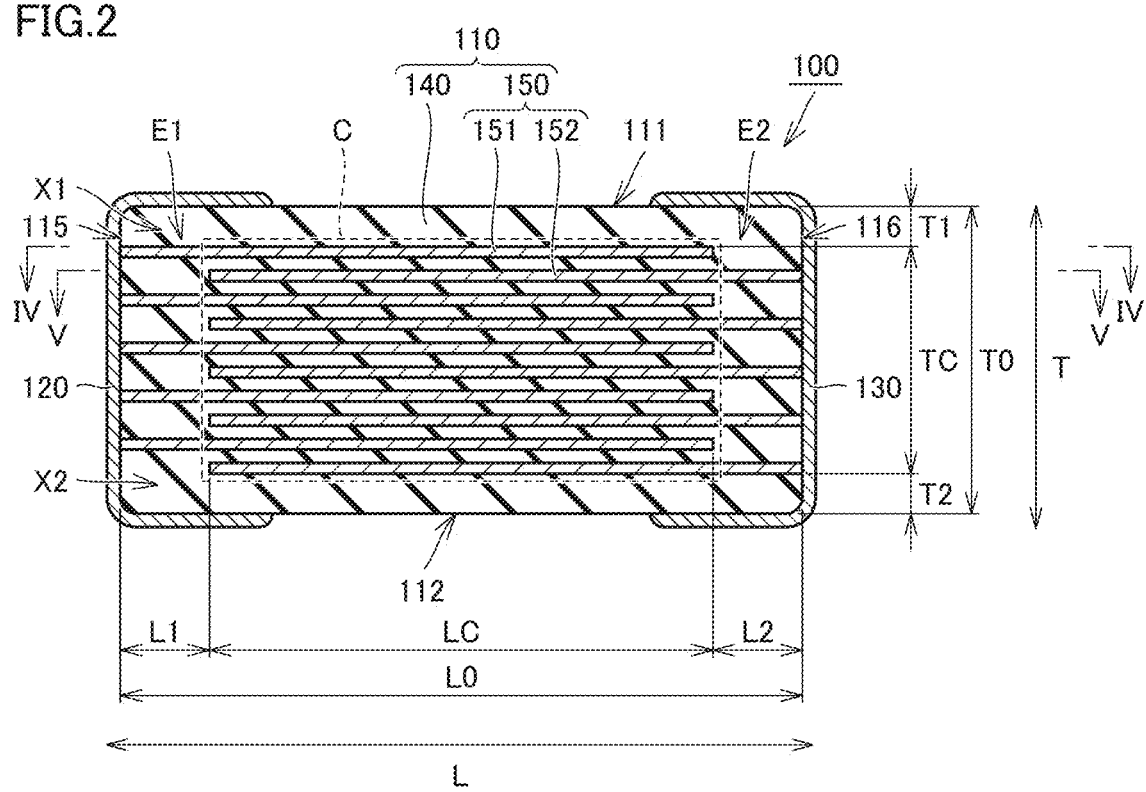
FIG. 2 is a cross sectional view showing the capacitor chip of FIG. 1 when viewed in a direction of a line arrow II-II.
Figure 3:
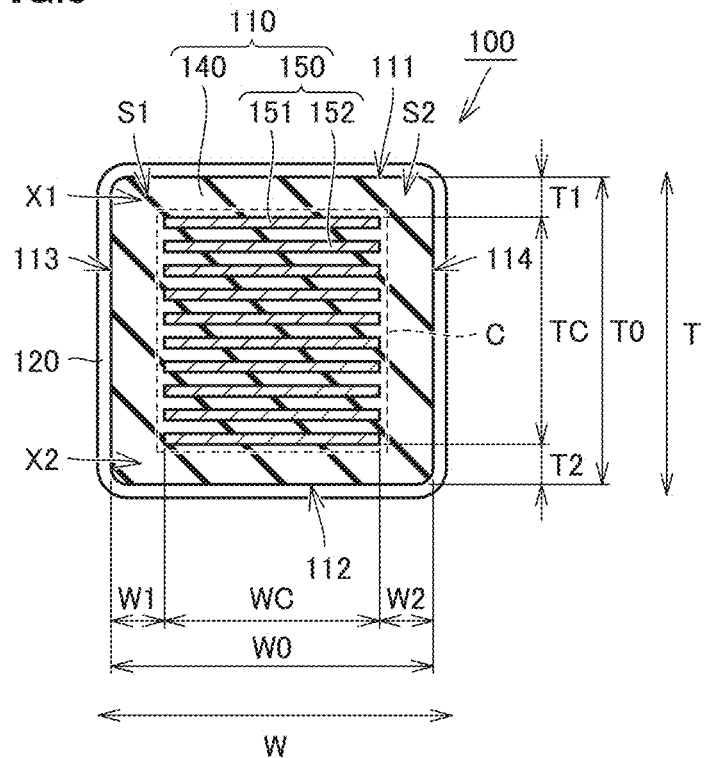
FIG. 3 is a cross sectional view showing the capacitor chip of FIG. 1 when viewed in a direction of a line arrow III-III.
Figure 4:
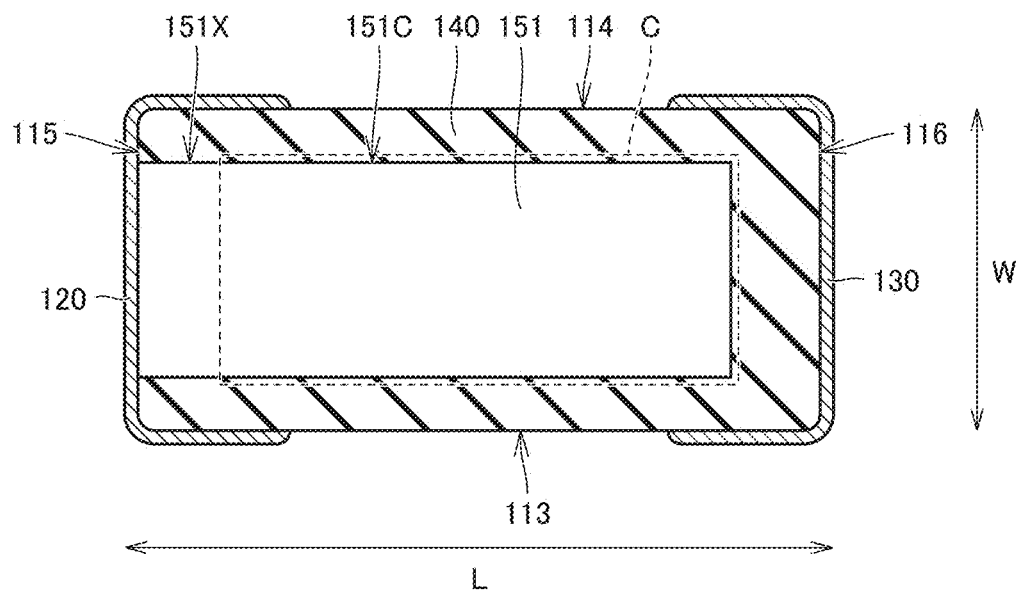
FIG. 4 is a cross sectional view showing the capacitor chip of FIG. 2 when viewed in a direction of a line arrow IV-IV.
Figure 5:
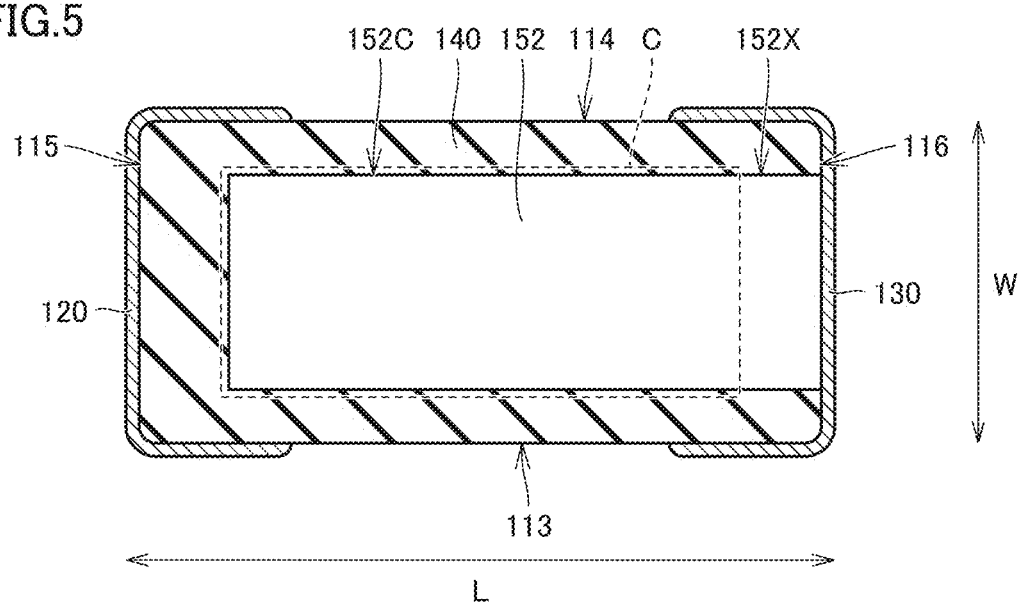
FIG. 5 is a cross sectional view showing the capacitor chip of FIG. 2 when viewed in a direction of a line arrow V-V.

FIG. 1 is a perspective view showing the capacitor chip included in the supporting-terminal-equipped capacitor chip according to the first preferred embodiment of the present invention. FIG. 2 is a cross sectional view showing the capacitor chip of FIG. 1 when viewed in a direction of a line arrow II-II. FIG. 3 is a cross sectional view showing the capacitor chip of FIG. 1 when viewed in a direction of a line arrow FIG. 4 is a cross sectional view showing the capacitor chip of FIG. 2 when viewed in a direction of a line arrow IV-IV. FIG. 5 is a cross sectional view showing the capacitor chip of FIG. 2 when viewed in a direction of a line arrow V-V. In each of FIGS. 1 to 5, the length direction of a below-described multilayer body is represented by L, the width direction of the multilayer body is represented by W, and the layering direction of the multilayer body is represented by T.

As shown in FIGS. 1 to 5, a capacitor chip 100 included in the supporting-terminal-equipped capacitor chip according to the first preferred embodiment of the present invention includes a multilayer body 110, a first outer electrode 120, and a second outer electrode 130. Multilayer body 110 includes a plurality of dielectric layers 140 and a plurality of inner electrode layers 150, which are alternately layered along layering direction T.

Multilayer body 110 includes a first main surface 111 and a second main surface 112 facing each other in layering direction T, a first side surface 113 and a second side surface 114 facing each other in width direction W orthogonal or substantially orthogonal to layering direction T, and a first end surface 115 and a second end surface 116 facing each other in length direction L orthogonal or substantially orthogonal to both layering direction T and width direction W.

First outer electrode 120 extends from first end surface 115 onto a portion of each of first main surface 111 and second main surface 112 adjacent to first end surface 115. The portion adjacent to first end surface 115 refers to a portion closest to first end surface 115 among four portions obtained by equally dividing multilayer body 110 into four in length direction L. In the present preferred embodiment, first outer electrode 120 extends from first end surface 115 onto a portion of each of first side surface 113 and second side surface 114 adjacent to first end surface 115.

Second outer electrode 130 extends from second end surface 116 onto a portion of each of first main surface 111 and second main surface 112 adjacent to second end surface 116. The portion adjacent to second end surface 116 refers to a portion closest to second end surface 116 among four portions obtained by equally dividing multilayer body 110 into four in length direction L. In the present preferred embodiment, second outer electrode 130 extends from second end surface 116 onto a portion of each of first side surface 113 and second side surface 114 adjacent to second end surface 116.

The plurality of inner electrode layers 150 include a plurality of first inner electrode layers 151 connected to first outer electrode 120, and a plurality of second inner electrode layers 152 connected to second outer electrode 130. Each of FIGS. 2 and 3 illustrates an example in which five first inner electrode layers 151 and five second inner electrode layers 152 are provided. However, each of the number of first inner electrode layers 151 and the number of second inner electrode layers 152 is not limited to five.

As shown in FIG. 4, first inner electrode layer 151 includes a facing portion 151C facing second inner electrode layer 152, and a drawn portion 151X extending to first end surface 115. As shown in FIG. 5, second inner electrode layer 152 includes a facing portion 152C facing first inner electrode layer 151, and a drawn portion 152X extending to second end surface 116.

As shown in FIGS. 2 to 5, multilayer body 110 is divided into an inner layer portion C, a first outer layer portion X1, a second outer layer portion X2, a first side margin portion S1, a second side margin portion S2, a first end margin portion E1, and a second end margin portion E2.

Inner layer portion C has a capacitance with facing portion 151C of first inner electrode layer 151 and facing portion 152C of second inner electrode layer 152 being layered in layering direction T. First outer layer portion X1 is located on the first main surface 111 side with respect to inner layer portion C in layering direction T. Second outer layer portion X2 is located on the second main surface 112 side with respect to inner layer portion C in layering direction T.

First side margin portion S1 is located on the first side surface 113 side with respect to inner layer portion C in width direction W. Second side margin portion S2 is located on the second side surface 114 side with respect to inner layer portion C in width direction W. First end margin portion E1 is located on the first end surface 115 side with respect to inner layer portion C in length direction L. Second end margin portion E2 is located on the second end surface 116 side with respect to inner layer portion C in length direction L.

A size of multilayer body 110 in length direction L is defined as L0, a size of multilayer body 110 in width direction W is defined as W0, a size of multilayer body 110 in layering direction T is defined as T0, a size of first outer layer portion X1 in layering direction T is defined as T1, a size of second outer layer portion X2 in layering direction T is defined as T2, a size of first side margin portion S1 in width direction W is defined as W1, a size of second side margin portion S2 in width direction W is defined as W2, a size of first end margin portion E1 in length direction L is defined as L1, a size of second end margin portion E2 in length direction L is defined as L2, and a size of inner layer portion C in length direction L is defined as LC, a size of inner layer portion C in width direction W is defined as WC, and a size of inner layer portion C in layering direction T is defined as TC.

In the present preferred embodiment, for example, size L0 of multilayer body 110 in length direction L is preferably more than or equal to about 1.0 mm, size W0 of multilayer body 110 in width direction W is preferably more than or equal to about 0.5 mm, and size T0 of multilayer body 110 in layering direction T is preferably more than or equal to about 0.5 mm. Size L0 of multilayer body 110 in length direction L and size W0 of multilayer body 110 in width direction W are sizes at the central portion of multilayer body 110 in layering direction T, and size T0 of multilayer body 110 in layering direction T is a size at the central portion of multilayer body 110 in length direction L. The sizes of multilayer body 110 can be measured using a micrometer or an optical microscope.

Multilayer body 110 preferably has rounded corner portions and ridgeline portions. Each of the corner portions is a portion at which three surfaces of multilayer body 110 intersect one another. Each of the ridgeline portions is a portion at which two surfaces of multilayer body 110 intersect each other.

The thickness of each dielectric layer 140 located in inner layer portion C is preferably more than or equal to about 0.5 μm and less than or equal to about 10 μm, for example. Further, each of size T1 of first outer layer portion X1 and size T2 of second outer layer portion X2 is preferably more than or equal to about 100 μm and less than or equal to about 200 μm, for example. Each of the thickness of dielectric layer 140 located in inner layer portion C, size T1 of first outer layer portion X1, and size T2 of second outer layer portion X2 is a size at the central portion of multilayer body 110 in width direction W.

Each of the plurality of dielectric layers 140 preferably includes, as a main component, for example, dielectric particles each having a perovskite structure containing at least Ti, such as $BaTiO_3$, $CaTiO_3$, or $SrTiO_3$. In addition to the main component, an accessory component having a content smaller than that of the main component may be included therein. The accessory component is preferably, for example, at least one of a Mn compound, a Mg compound, a Si compound, a Fe compound, a Cr compound, a Co compound, a Ni compound, an Al compound, a V compound, and a rare earth compound. The dielectric constant of the material of dielectric layer 140 is preferably more than or equal to about 1000, for example.

The thickness of each of first inner electrode layer 151 and second inner electrode layer 152 is preferably more than or equal to about 0.2 μm and less than or equal to about 2.0 μm, for example. As a material of each of first inner electrode layer 151 and second inner electrode layer 152, for example, one metal selected from a group consisting of Ni, Cu, Ag, Pd, and Au, or an alloy containing the metal may preferably be used. For example, an alloy of Ag and Pd or the like can be used. Each of first inner electrode layer 151 and second inner electrode layer 152 may include dielectric particles having the same composition as or a similar composition to that of a dielectric ceramic included in dielectric layer 140.

The thickness of each of dielectric layer 140, first inner electrode layer 151, and second inner electrode layer 152 can be measured by the following method.

First, a surface of multilayer body 110 defined by layering direction T and width direction W, i.e., a surface of multilayer body 110 orthogonal or substantially orthogonal to length direction L is exposed by grinding. The exposed cross section is observed by a scanning electron microscope. Next, the thickness of dielectric layer 140 is measured on a total of the following five lines: a central line extending through the center of the exposed cross section along layering direction T, two lines at equal or substantially equal intervals on one side with respect to the center line, and two lines at equal or substantially equal intervals on the other side with respect to the center line. The average value of the five measured values is regarded as the thickness of dielectric layer 140.

The thickness of each of first inner electrode layer 151 and second inner electrode layer 152 can also be measured using a scanning electron microscope in the same or substantially the same cross section as the cross section in which the thickness of dielectric layer 140 is measured, in a manner similar to that in the method for measuring the thickness of dielectric layer 140.

First outer electrode 120 is provided on the entire or substantially the entire first end surface 115 of multilayer body 110 and extends from first end surface 115 onto first main surface 111, second main surface 112, first side surface 113, and second side surface 114. First outer electrode 120 is electrically connected to first inner electrode layer 151.

Second outer electrode 130 is provided on the entire or substantially the entire second end surface 116 of multilayer body 110 and extends from second end surface 116 onto first main surface 111, second main surface 112, first side surface 113, and second side surface 114. Second outer electrode 130 is electrically connected to second inner electrode layer 152.

Each of first outer electrode 120 and second outer electrode 130 includes, for example, an underlying electrode layer and a plating layer disposed on the underlying electrode layer. The underlying electrode layer includes at least one of a baked electrode layer, a resin electrode layer, a thin film electrode layer, and the like.

The baked electrode layer is a layer including glass and a metal. One baked electrode layer or a plurality of baked electrode layers may be provided. The baked electrode layer is preferably made of, for example, one metal selected from a group consisting of Ni, Cu, Ag, Pd and Au, or an alloy including the metal. For example, the baked electrode includes an alloy of Ag and Pd, or the like.

The baked electrode layer is formed by applying an electrically conductive paste including the glass and the metal onto multilayer body 110 and performing baking thereto. The baking may be performed simultaneously with calcination of multilayer body 110 or may be performed after the calcination of multilayer body 110.

The resin electrode layer can be a layer including electrically conductive particles and a thermosetting resin, for example. In the case of forming the resin electrode layer, the resin electrode layer may be directly formed on the multilayer body without forming the baked electrode layer. One resin electrode layer or a plurality of resin electrode layers may be provided.

The thin film electrode layer is a layer having a thickness of less than or equal to about 1 μm in which metal particles are deposited, for example. The thin film electrode layer can be formed by a known thin film forming method, such as a sputtering method or a vapor deposition method, for example.

The plating layer disposed on the underlying electrode layer is preferably made of one metal selected from a group consisting of Ni, Cu, Ag, Pd and Au, or an alloy including the metal, for example. For example, the plating layer includes an alloy of Ag and Pd or the like. One plating layer or a plurality of plating layers may be provided. It should be noted that the plating layer preferably has a two-layer structure in which a Sn plating layer is provided on a Ni plating layer. The Ni plating layer prevents the underlying electrode layer from being eroded by a solder when mounting capacitor chip 100. The Sn plating layer improves solder wettability when mounting capacitor chip 100.

It should be noted that each of first outer electrode 120 and second outer electrode 130 may include no underlying electrode layer and may include a plating layer directly disposed on multilayer body 110. In this case, the plating layer is directly connected to first inner electrode layer 151 or second inner electrode layer 152. The ratio of the metal of the plating layer per unit volume is preferably more than or equal to about 99 volume %, for example. Further, the plating layer preferably includes no glass.

Here, the following describes a result of simulation analysis on a distribution of strain of multilayer body 110 caused when voltage is applied to capacitor chip 100.

Figure 6:
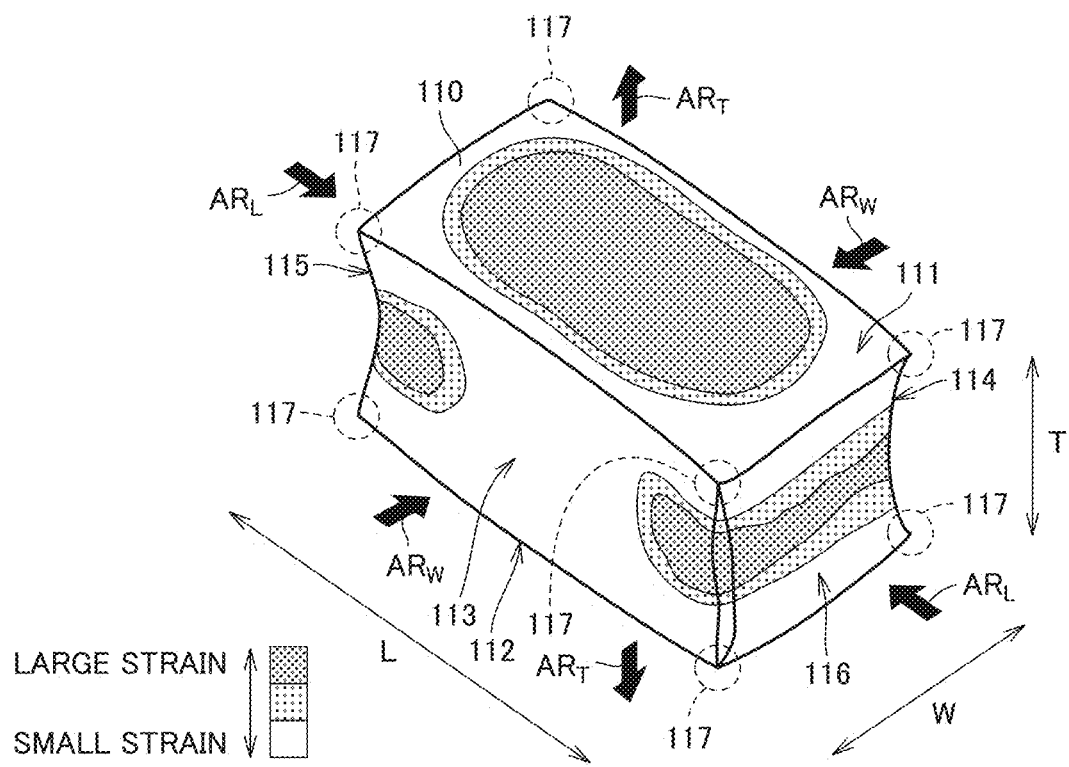
FIG. 6 is a diagram showing a result of simulation analysis on strain caused when voltage is applied to a multilayer body of the capacitor chip included in the supporting-terminal-equipped capacitor chip according to the first preferred embodiment of the present invention.

FIG. 6 is a diagram showing the result of simulation analysis on strain caused when voltage is applied to the multilayer body of the capacitor chip included in the supporting-terminal-equipped capacitor chip according to the first preferred embodiment of the present invention. As shown in FIG. 6, when voltage is applied, multilayer body 110 is strained outwardly along layering direction T as indicated by arrows $AR_T$ in the figure. Accordingly, in order to maintain the volume of multilayer body 110, multilayer body 110 is strained inwardly along length direction L as indicated by arrows $AR_L$ in FIG. 6 and is strained inwardly along width direction W as indicated by arrows $AR_W$ in FIG. 6. On the other hand, at each of corner portions 117 of multilayer body 110, substantially no strain is caused.

In addition, strain is relatively small at each of a position of first main surface 111 adjacent to first end surface 115 and a position of first main surface 111 adjacent to second end surface 116. Strain is relatively small at each of a position of first side surface 113 adjacent to first main surface 111 and a position of first side surface 113 adjacent to second main surface 112.

Thus, strain is caused in capacitor chip 100 repeatedly in accordance with a cycle of voltage applied to capacitor chip 100. As a result, the circuit board on which capacitor chip 100 is mounted is vibrated. When the frequency of the vibration of the circuit board is in an audible sound range, the vibration is recognized as noise by human beings.

Figure 7:
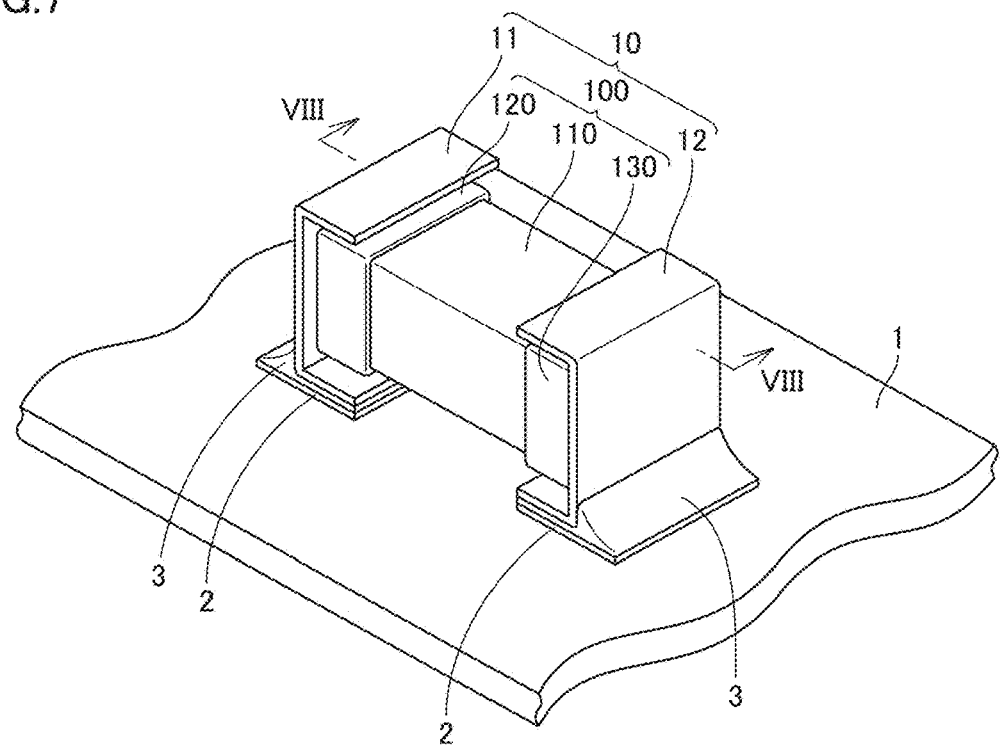
FIG. 7 is a perspective view showing a structure in which the supporting-terminal-equipped capacitor chip according to the first preferred embodiment of the present invention is mounted on a circuit board.
Figure 8:
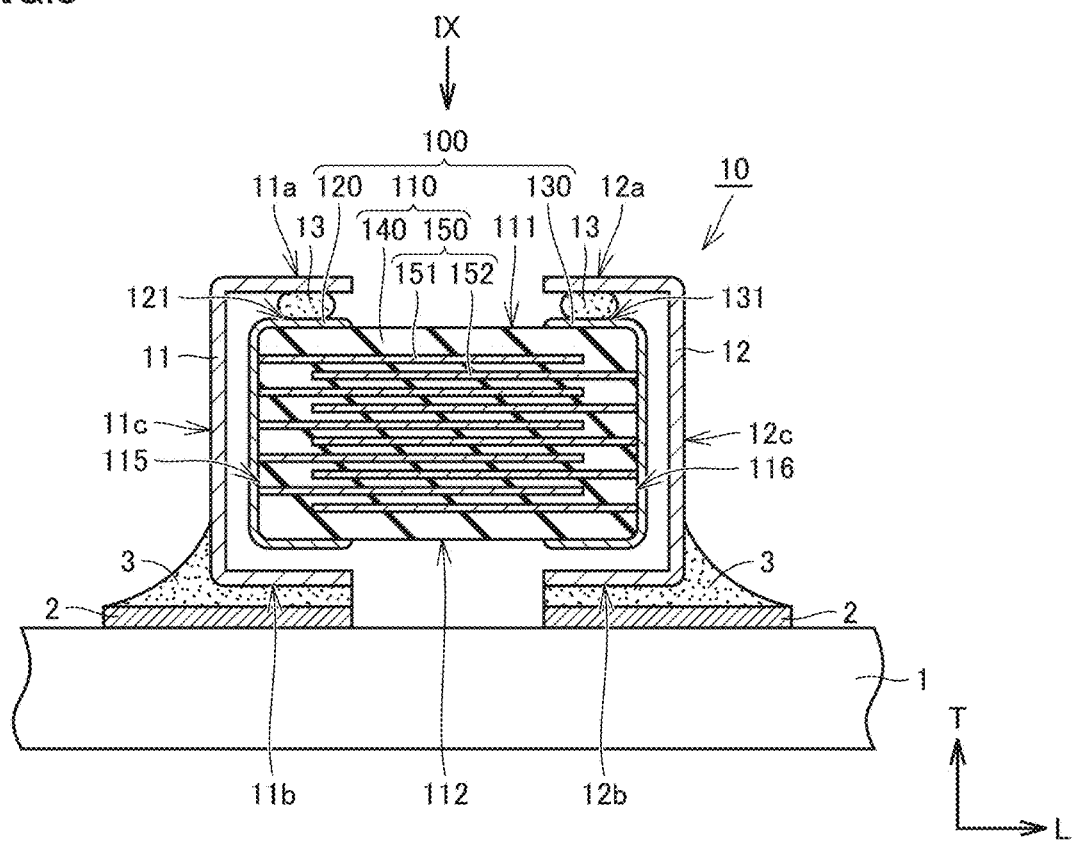
FIG. 8 is a cross sectional view showing the structure in which the supporting-terminal-equipped capacitor chip of FIG. 7 is mounted on the circuit board when viewed in a direction of a line arrow VIII-VIII.
Figure 9:
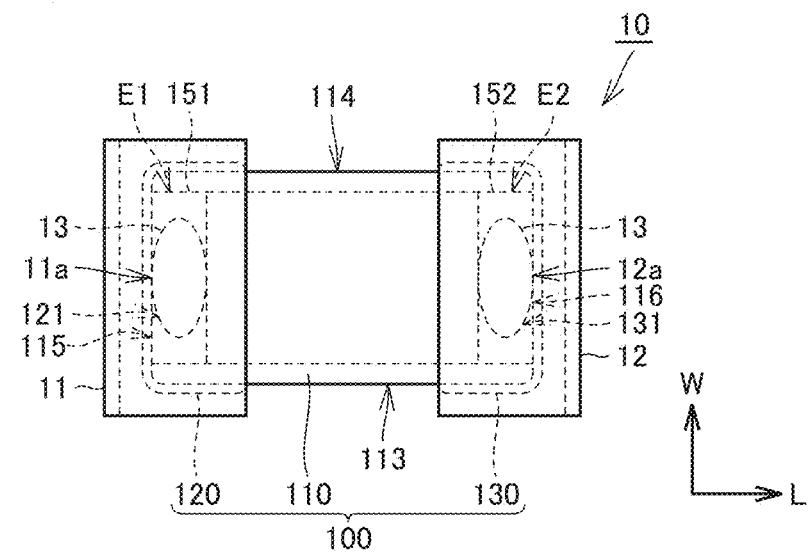
FIG. 9 is a plan view showing the supporting-terminal-equipped capacitor chip of FIG. 8 when viewed in a direction of an arrow IX.
Figure 10:
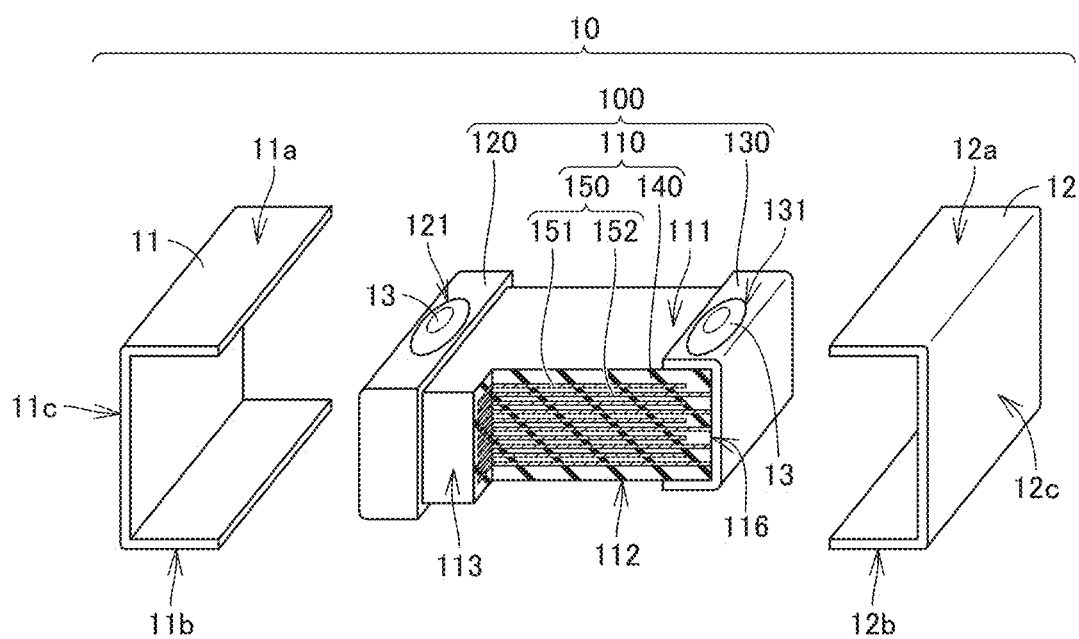
FIG. 10 is an exploded perspective view showing a configuration of the supporting-terminal-equipped capacitor chip according to the first preferred embodiment of the present invention.

FIG. 7 is a perspective view showing a structure in which the supporting-terminal-equipped capacitor chip according to the first preferred embodiment of the present invention is mounted on a circuit board. FIG. 8 is a cross sectional view showing the structure in which the supporting-terminal-equipped capacitor chip of FIG. 7 is mounted on the circuit board when viewed in a direction of a line arrow VIII-VIII. FIG. 9 is a plan view showing the supporting-terminal-equipped capacitor chip of FIG. 8 when viewed in a direction of an arrow IX. FIG. 10 is an exploded perspective view showing a configuration of the supporting-terminal-equipped capacitor chip according to the first preferred embodiment of the present invention.

As shown in FIGS. 7 to 10, supporting-terminal-equipped capacitor chip 10 according to the first preferred embodiment of the present invention includes capacitor chip 100, and a first supporting terminal 11 and a second supporting terminal 12 that hold capacitor chip 100 therebetween. First supporting terminal 11 and second supporting terminal 12 are electrically conductive.

As shown in FIGS. 8 to 10, first supporting terminal 11 is connected to a first connection portion 121 of first outer electrode 120 on first main surface 111. That is, first connection portion 121 is a portion of first outer electrode 120 located on first main surface 111 and connected to first supporting terminal 11.

Second supporting terminal 12 is connected to a second connection portion 131 of second outer electrode 130 on first main surface 111. That is, second connection portion 131 is a portion of second outer electrode 130 located on first main surface 111 and connected to second supporting terminal 12.

Specifically, first supporting terminal 11 includes a first supporting portion 11a connected to first connection portion 121, a first terminal portion 11b connected to circuit board 1 on which capacitor chip 100 is mounted, and a first linking portion 11c that links first supporting portion 11a to first terminal portion 11b. First supporting portion 11a extends from one end of first linking portion 11c in layering direction T to the capacitor chip 100 side in length direction L, and first terminal portion 11b extends from the other end of first linking portion 11c in layering direction T to the capacitor chip 100 side in length direction L. As a result, first supporting portion 11a and first terminal portion 11b face each other with a space being interposed therebetween. First supporting terminal 11 has a C shape or a substantially C shape when viewed in width direction W. It should be noted that the shape of first supporting terminal 11 is not limited to the C or substantially C shape, and may be any shape as long as capacitor chip 100 can be held.

Second supporting terminal 12 includes a second supporting portion 12a connected to second connection portion 131, a second terminal portion 12b connected to circuit board 1 on which capacitor chip 100 is mounted, and a second linking portion 12c that links second supporting portion 12a to second terminal portion 12b. Second supporting portion 12a extends from one end of second linking portion 12c in layering direction T to the capacitor chip 100 side in length direction L, and second terminal portion 12b extends from the other end of second linking portion 12c in layering direction T to the capacitor chip 100 side in length direction L. As a result, second supporting portion 12a and second terminal portion 12b face each other with a space being interposed therebetween. Second supporting terminal 12 has a C shape or a substantially C shape when viewed in width direction W. It should be noted that the shape of second supporting terminal 12 is not limited to the C shape or the substantially C shape, and may be any shape as long as capacitor chip 100 can be held.

Each of first supporting terminal 11 and second supporting terminal 12 is defined by one bent metal thin plate. Each of first supporting terminal 11 and second supporting terminal includes a terminal body and a plating layer provided on a surface of the terminal body.

The terminal body preferably includes, for example, Ni, Fe, Cu, Ag, Cr, or an alloy including one or more of these metals as a main component. Specifically, as a base material of the terminal body, for example, an Fe-18Cr alloy, an Fe-42Ni alloy, a Cu-8Sn alloy, or the like may preferably be used. The thickness of the terminal body is preferably more than or equal to about 0.05 mm and less than or equal to about 0.5 mm, for example.

The plating layer preferably includes a lower plating layer provided on the surface of the terminal body, and an upper plating layer provided on a surface of the lower plating layer. It should be noted that each of the lower plating layer and the upper plating layer may include a plurality of plating layers. The thickness of the lower plating layer is preferably more than or equal to about 0.2 μm and less than or equal to about 5.0 μm, for example. The thickness of the upper plating layer is preferably more than or equal to about 1.0 μm and less than or equal to about 5.0 μm, for example.

The lower plating layer preferably includes Ni, Fe, Cu, Ag, Cr, or an alloy including one or more of these metals as a main component, for example. Preferably, the lower plating layer is made of Ni, Fe, Cr, or an alloy including one or more of these metals as a main component, for example.

The upper plating layer includes, for example, Sn, Ag, Au, or an alloy including one or more of these metals as a main component. Preferably, the upper plating layer includes Sn or an alloy including Sn as a main component, for example. Since the upper plating layer includes Sn or the alloy including Sn as a main component, each of first supporting terminal 11 and second supporting terminal 12 can be improved in solder wettability.

As shown in FIGS. 8 to 10, first terminal portion 11b is connected to a land 2 provided on a main surface of circuit board 1, by an electrically conductive bonding material 3 such as a solder, for example. Second terminal portion 12b is connected to a land 2 provided on the main surface of circuit board 1, by an electrically conductive bonding material 3.

First supporting portion 11a is connected to first connection portion 121 by an electrically conductive bonding material 13 such as a solder, for example. It should be noted that first supporting portion 11a and first connection portion 121 may be connected to each other via a vibration damping member such as a winding, for example.

Second supporting portion 12a is connected to second connection portion 131 by an electrically conductive bonding material 13. It should be noted that second supporting portion 12a and second connection portion 131 may be connected to each other via a vibration damping member such as a winding, for example.

When a solder is used as each of electrically conductive bonding material 3 and electrically conductive bonding material 13, it is preferable to use a lead-free solder such as a Sn—Sb-based solder, a Sn—Ag—Cu-based solder, a Sn—Cu-based solder, or a Sn—Bi-based solder, for example. When the Sn—Sb solder is used, the content of Sb is preferably more than or equal to about 5% and less than or equal to about 15%, for example.

As shown in FIGS. 8 to 10, first connection portion 121 is located on first main surface 111 adjacent to first end surface 115. As shown in FIG. 9, at least a portion of first connection portion 121 overlies first end margin portion E1 when viewed in layering direction T. In the present preferred embodiment, the entire or substantially the entire first connection portion 121 overlies first end margin portion E1 when viewed in layering direction T. In multilayer body 110, first connection portion 121 is located at a position at which relatively small strain is caused when voltage is applied as shown in FIG. 6.

Second connection portion 131 is located on first main surface 111 adjacent to second end surface 116. At least a portion of second connection portion 131 overlies second end margin portion E2 when viewed in layering direction T. In the present preferred embodiment, the entire or substantially the entire second connection portion 131 overlies second end margin portion E2 when viewed in layering direction T. In multilayer body 110, second connection portion 131 is located at a position at which relatively small strain is caused when voltage is applied as shown in FIG. 6.

As shown in FIG. 8, in a state in which capacitor chip 100 is held between first supporting terminal 11 and second supporting terminal 12, a portion of capacitor chip 100 other than first connection portion 121 and first supporting terminal 11 are separated from each other, and a portion of capacitor chip 100 other than second connection portion 131 and second supporting terminal 12 are separated from each other.

That is, capacitor chip 100 and first supporting terminal 11 are connected to each other only at first connection portion 121 and first supporting portion 11a, and the other portions thereof are located with a space being interposed therebetween. Capacitor chip 100 and second supporting terminal 12 are connected to each other only at second connection portion 131 and second supporting portion 12a, and the other portions thereof are located with a space being interposed therebetween.

Here, the following describes an experiment example in which the supporting-terminal-equipped capacitor chip according to the first preferred embodiment of the present invention and the multilayer ceramic capacitor having the terminal frames shown in FIG. 4 of Japanese Patent Laid-Open No. 2015-19037 were compared in terms of the entire band sound pressure level of acoustic noise generated when voltage is applied. It should be noted that the supporting-terminal-equipped capacitor chip according to the first preferred embodiment of the present invention and the multilayer ceramic capacitor having the terminal frames shown in FIG. 4 of Japanese Patent Laid-Open No. 2015-19037 have the same or substantially the same capacitor chip outer shape and have the same or substantially the same capacitance.

Figure 11:
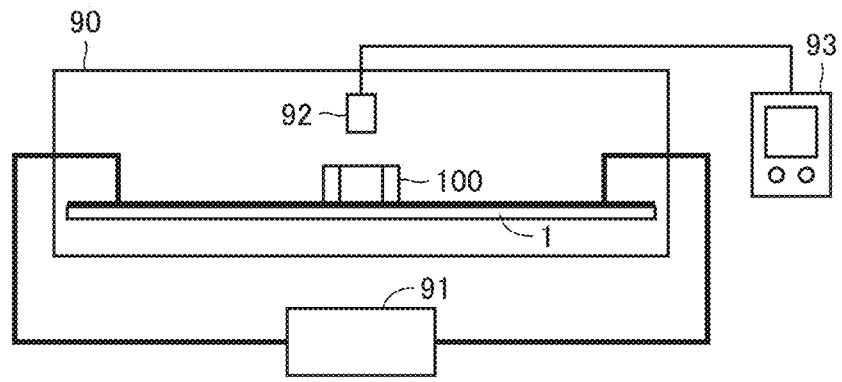
FIG. 11 is a schematic configuration diagram of a sound pressure measuring apparatus.

FIG. 11 is a schematic configuration diagram of a sound pressure measuring apparatus. As shown in FIG. 11, circuit board on which supporting-terminal-equipped capacitor chip 10 is mounted is accommodated in a non-reverberation box 90. The sound pressure measuring apparatus includes a power supply device 91 that applies voltage from a mounting electrode pattern provided on circuit board 1. The sound pressure measuring apparatus includes a microphone 92. In non-reverberation box 90, microphone 92 is disposed directly above supporting-terminal-equipped capacitor chip 10 mounted on circuit board 1. Microphone 92 collects sound emitted from circuit board 1. Microphone 92 is preferably installed at a position above the vicinity of the center of supporting-terminal-equipped capacitor chip 10 in the length direction. Microphone 92 is disposed to be separated from circuit board 1 by about 3 mm. Microphone 92 is connected to an FFT (fast Fourier transform) analyzer 93 for detecting a sound pressure. As FFT analyzer 93, CF-5220 provided by Ono Sokki was used. Supporting-terminal-equipped capacitor chip 10 is fed with DC=4 V and AC voltage of AC=1 Vpp so as to measure the sound pressure level. The sound pressure level was measured in the same or similar manner in the multilayer ceramic capacitor having the terminal frames shown in FIG. 4 of Japanese Patent Laid-Open No. 2015-19037.

As a result, in supporting-terminal-equipped capacitor chip 10 according to the first preferred embodiment of the present invention, it was confirmed that the entire band sound pressure level of acoustic noise was reduced by about 20 dB as compared with the multilayer ceramic capacitor having the terminal frames shown in FIG. 4 of Japanese Patent Laid-Open No. 2015-19037. The entire band sound pressure level is a total of respective sound pressure levels in frequency bands of more than or equal to about 20 Hz and less than or equal to about 20 kHz.

In supporting-terminal-equipped capacitor chip 10 according to the first preferred embodiment of the present invention, first connection portion 121 is located on first main surface 111 adjacent to first end surface 115, and second connection portion 131 is located on first main surface 111 adjacent to second end surface 116.

Thus, first connection portion 121 and second connection portion 131 are located at positions at each of which relatively small strain is caused when voltage is applied to capacitor chip 100, thus reducing the magnitude of the vibration propagated from capacitor chip 100 to first supporting terminal 11 and second supporting terminal 12.

Further, in supporting-terminal-equipped capacitor chip according to the first preferred embodiment of the present invention, the portion of capacitor chip 100 other than first connection portion 121 and first supporting terminal 11 are separated from each other, and the portion of capacitor chip 100 other than second connection portion 131 and second supporting terminal 12 are separated from each other.

Thus, the vibration of capacitor chip 100 can be propagated to first supporting terminal 11 only through first connection portion 121 and first supporting portion 11a, and the vibration of capacitor chip 100 can be propagated to second supporting terminal 12 only through second connection portion 131 and second supporting portion 12a. As a result, a vibration propagation path can be secured to be long to damp the vibration in each of first supporting terminal 11 and second supporting terminal 12, thus reducing the vibration propagated to circuit board 1.

As described above, in supporting-terminal-equipped capacitor chip 10 according to the first preferred embodiment of the present invention, the magnitude of the vibration propagated from capacitor chip 100 to each of first supporting terminal 11 and second supporting terminal 12 is reduced and the vibration is damped when propagated through each of first supporting terminal 11 and second supporting terminal 12, such that the vibration is less likely to be transferred from each of first supporting terminal 11 and second supporting terminal 12 to circuit board 1. Accordingly, acoustic noise can be reduced or prevented.

In supporting-terminal-equipped capacitor chip 10 according to the first preferred embodiment of the present invention, at least a portion of first connection portion 121 overlies first end margin portion E1 when viewed in layering direction T, and at least a portion of second connection portion 131 overlies second end margin portion E2 when viewed in layering direction T.

Each of first end margin portion E1 and second end margin portion E2 is a position at which a piezoelectric phenomenon is less likely to occur as compared with inner layer portion C. Therefore, since at least a portion of first connection portion 121 overlies first end margin portion E1 when viewed in layering direction T and at least a portion of second connection portion 131 overlies second end margin portion E2 when viewed in layering direction T, the magnitude of the vibration propagated from capacitor chip 100 to first supporting terminal 11 and second supporting terminal 12 can be reduced or prevented.

In supporting-terminal-equipped capacitor chip 10 according to the first preferred embodiment of the present invention, first supporting terminal 11 includes first supporting portion 11a connected to first connection portion 121, first terminal portion 11b connected to circuit board 1 on which capacitor chip 100 is mounted, and first linking portion 11c that links first supporting portion 11a to first terminal portion 11b. Second supporting terminal 12 includes second supporting portion 12a connected to second connection portion 131, second terminal portion 12b connected to circuit board 1 on which capacitor chip 100 is mounted, and second linking portion 12c that links second supporting portion 12a to second terminal portion 12b.

Thus, the vibration is damped when the vibration is propagated in each of first linking portion 11c and second linking portion 12c, such that the vibration is less likely to be transferred from each of first supporting terminal 11 and second supporting terminal 12 to circuit board 1. Accordingly, acoustic noise can be reduced or prevented.

In supporting-terminal-equipped capacitor chip 10 according to the first preferred embodiment of the present invention, first supporting portion 11a and first terminal portion 11b face each other with a space being interposed therebetween, and second supporting portion 12a and second terminal portion 12b face each other with a space being interposed therebetween. Accordingly, a mounting space for supporting-terminal-equipped capacitor chip 10 can be small.

In supporting-terminal-equipped capacitor chip 10 according to the first preferred embodiment of the present invention, each of first supporting terminal 11 and second supporting terminal 12 is defined by one bent metal thin plate. Thus, each of first supporting terminal 11 and second supporting terminal 12 can be readily manufactured.

Second Preferred Embodiment

Hereinafter, a supporting-terminal-equipped capacitor chip according to a second preferred embodiment of the present invention will be described with reference to the drawings. The supporting-terminal-equipped capacitor chip according to the second preferred embodiment of the present invention is different from supporting-terminal-equipped capacitor chip 10 according to the first preferred embodiment of the present invention mainly in that a solder resist is provided on each of first linking portion 11c and second linking portion 12c. Therefore, the same or substantially the same configurations as those of supporting-terminal-equipped capacitor chip 10 according to the first preferred embodiment of the present invention will not be repeatedly described.

Figure 12:
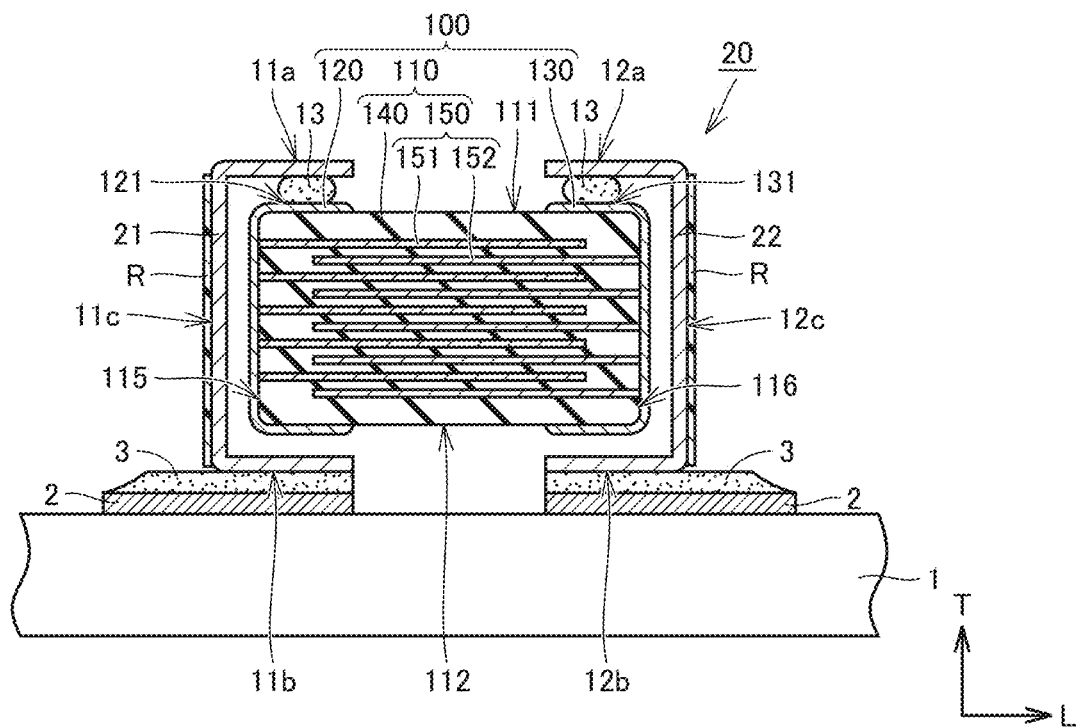
FIG. 12 is a cross sectional view showing a structure in which a supporting-terminal-equipped capacitor chip according to a second preferred embodiment of the present invention is mounted on a circuit board.

FIG. 12 is a cross sectional view showing a structure in which the supporting-terminal-equipped capacitor chip according to the second preferred embodiment of the present invention is mounted on a circuit board. FIG. 12 shows the cross section in the same or similar manner as in FIG. 8.

As shown in FIG. 12, in a supporting-terminal-equipped capacitor chip 20 according to the second preferred embodiment of the present invention, a surface of first linking portion 11c of first supporting terminal 11 opposite to the capacitor chip 100 side is covered with a solder resist R. Also, a surface of second linking portion 12c of second supporting terminal 12 opposite to the capacitor chip 100 side is covered with a solder resist R.

This can reduce or prevent formation of a fillet of electrically conductive bonding material 3. As a result, each of a vibration propagation path from first connection portion 121 to land 2 and a vibration propagation path from second connection portion 131 to land 2 can be secured to be long to damp the vibration in each of first supporting terminal 11 and second supporting terminal 12, thus reducing the vibration propagated to circuit board 1.

Third Preferred Embodiment

Hereinafter, a supporting-terminal-equipped capacitor chip according to a third preferred embodiment of the present invention will be described with reference to the drawings. The supporting-terminal-equipped capacitor chip according to the third preferred embodiment of the present invention is different from supporting-terminal-equipped capacitor chip 10 according to the first preferred embodiment of the present invention mainly in terms of the shape of each of the first supporting terminal and the second supporting terminal. Therefore, the same or similar configurations as those of supporting-terminal-equipped capacitor chip 10 according to the first preferred embodiment of the present invention will not be repeatedly described.

Figure 13:
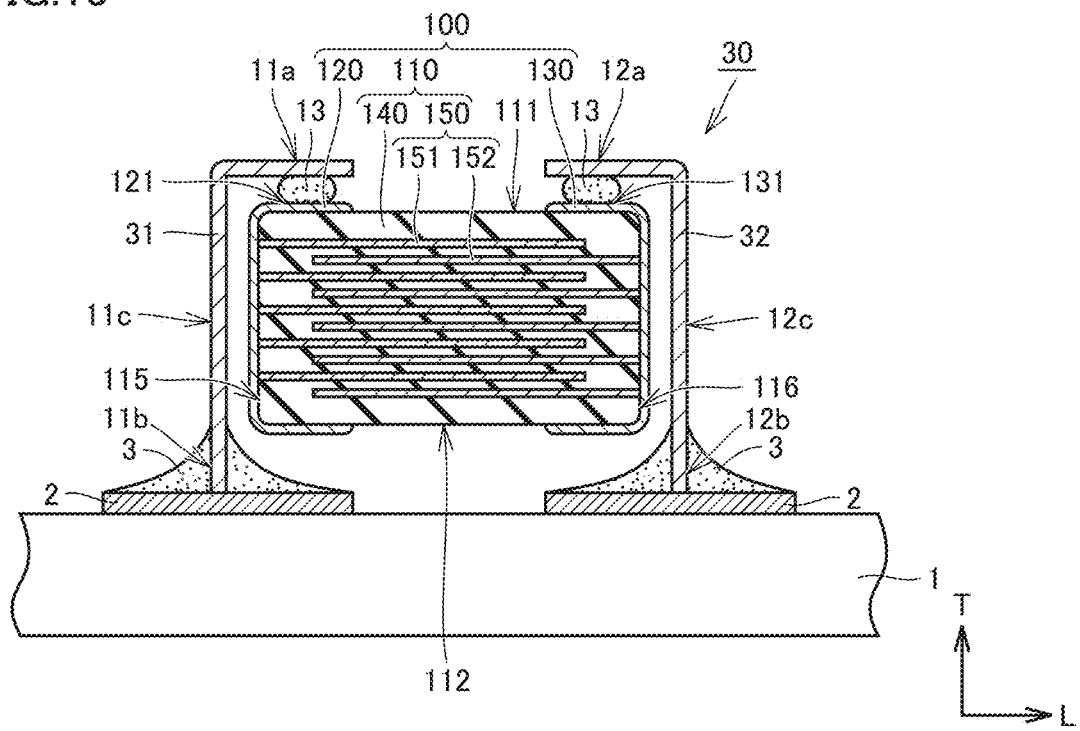
FIG. 13 is a cross sectional view showing a structure in which a supporting-terminal-equipped capacitor chip according to a third preferred embodiment of the present invention is mounted on a circuit board.

FIG. 13 is a cross sectional view showing a structure in which the supporting-terminal-equipped capacitor chip according to the third preferred embodiment of the present invention is mounted on a circuit board. FIG. 13 shows the cross section in the same manner as in FIG. 8.

As shown in FIG. 13, in a supporting-terminal-equipped capacitor chip 30 according to the third preferred embodiment of the present invention, each of a first supporting terminal 31 and a second supporting terminal 32 has an L shape or a substantially L shape when viewed in width direction W.

Specifically, in first supporting terminal 31, first terminal portion 11b and first linking portion 11c are provided as a flat plate. First terminal portion 11b is disposed on land 2 so as to be orthogonal or substantially orthogonal to land 2. In second supporting terminal 32, second terminal portion 12b and second linking portion 12c are provided as a flat plate.

Second terminal portion 12b is disposed on land 2 so as to be orthogonal or substantially orthogonal to land 2.

This reduces a contact area of each of first terminal portion 11b and second terminal portion 12b with electrically conductive bonding material 3 while reducing the height of supporting-terminal-equipped capacitor chip 30, such that the vibration is less likely to be transferred from each of first supporting terminal 31 and second supporting terminal 32 to circuit board 1. Accordingly, acoustic noise can be reduced or prevented.

Fourth Preferred Embodiment

Hereinafter, a supporting-terminal-equipped capacitor chip according to a fourth preferred embodiment of the present invention will be described with reference to the drawings. The supporting-terminal-equipped capacitor chip according to the fourth preferred embodiment of the present invention is different from supporting-terminal-equipped capacitor chip 10 according to the first preferred embodiment of the present invention mainly in terms of the shape of each of the first supporting terminal and the second supporting terminal. Therefore, the same or similar configurations as those of supporting-terminal-equipped capacitor chip 10 according to the first preferred embodiment of the present invention will not be repeatedly described.

Figure 14:
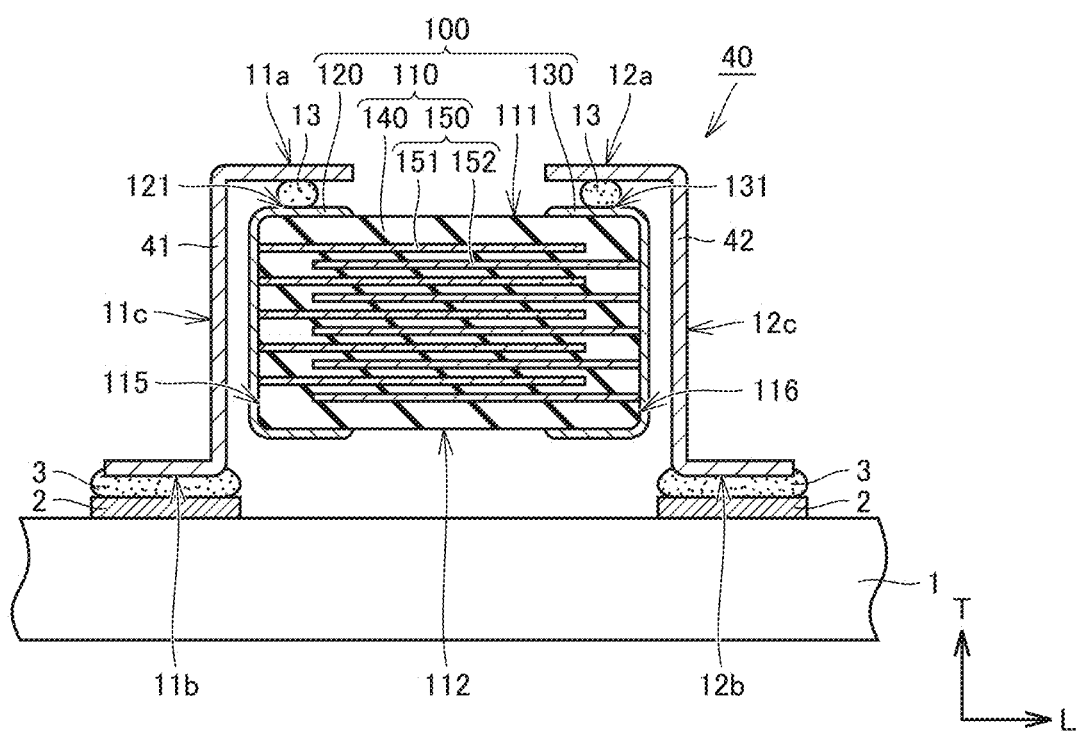
FIG. 14 is a cross sectional view showing a structure in which a supporting-terminal-equipped capacitor chip according to a fourth preferred embodiment of the present invention is mounted on a circuit board.

FIG. 14 is a cross sectional view showing a structure in which the supporting-terminal-equipped capacitor chip according to the fourth preferred embodiment of the present invention is mounted on a circuit board. FIG. 14 shows the cross section in the same manner as in FIG. 8.

As shown in FIG. 14, in a supporting-terminal-equipped capacitor chip 40 according to the fourth preferred embodiment of the present invention, each of a first supporting terminal 41 and a second supporting terminal 42 has an S shape or a substantially S shape when viewed in width direction W.

Specifically, in first supporting terminal 41, first supporting portion 11a and first terminal portion 11b extend oppositely in length direction L with respect to first linking portion 11c. First supporting portion 11a extends from one end of first linking portion 11c in layering direction T to the capacitor chip 100 side in length direction L, and first terminal portion 11b extends from the other end of first linking portion 11c in layering direction T to a side opposite to the capacitor chip 100 side in length direction L.

In second supporting terminal 42, second supporting portion 12a and second terminal portion 12b extend oppositely in length direction L with respect to second linking portion 12c. Second supporting portion 12a extends from one end of second linking portion 12c in layering direction T to the capacitor chip 100 side in length direction L, and second terminal portion 12b extends from the other end of second linking portion 12c in layering direction T to a side opposite to the capacitor chip 100 side in length direction L.

Since an interval between first terminal portion 11b and second terminal portion 12b is wide, mounting stability of supporting-terminal-equipped capacitor chip 40 can be improved.

Here, the following describes a modification in which each of first supporting terminal 41 and second supporting terminal 42 has a different shape. It should be noted that since the shape of the first supporting terminal is the same or substantially the same as that of the second supporting terminal, only the second supporting terminal will be described while the first supporting terminal will not be repeatedly described.

Figure 15:
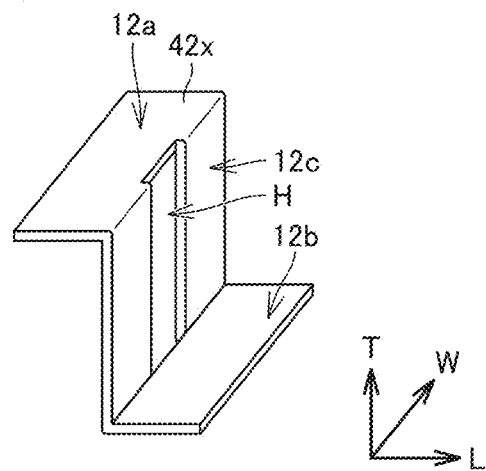
FIG. 15 is a perspective view showing a second supporting terminal included in a supporting-terminal-equipped capacitor chip according to a first modification of the fourth preferred embodiment of the present invention.

FIG. 15 is a perspective view showing a second supporting terminal included in a supporting-terminal-equipped capacitor chip according to a first modification of the fourth preferred embodiment of the present invention. As shown in FIG. 15, in a second supporting terminal 42x included in the supporting-terminal-equipped capacitor chip according to the first modification of the fourth preferred embodiment of the present invention, an opening H having a longitudinal direction along layering direction T is provided in second linking portion 12c. Thus, the elastic modulus of second linking portion 12c can be made small, thus improving vibration damping performance in second linking portion 12c. As a result, the vibration is less likely to be transferred from second supporting terminal 42x to circuit board 1, thereby reducing acoustic noise. It should be noted that opening H may have a longitudinal direction along width direction W.

Figure 16:
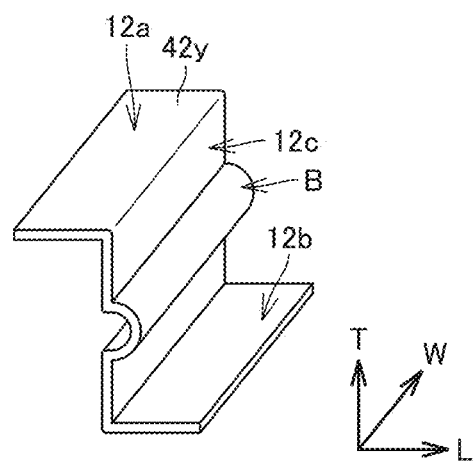
FIG. 16 is a perspective view showing a second supporting terminal included in a supporting-terminal-equipped capacitor chip according to a second modification of the fourth preferred embodiment of the present invention.

FIG. 16 is a perspective view showing a second supporting terminal included in a supporting-terminal-equipped capacitor chip according to a second modification of the fourth preferred embodiment of the present invention. As shown in FIG. 16, in a second supporting terminal 42y included in the supporting-terminal-equipped capacitor chip according to the second modification of the fourth preferred embodiment of the present invention, a curved portion B extending in width direction W is provided in second linking portion 12c. Thus, the elastic modulus of second linking portion 12c can be made small, thus improving vibration damping performance in second linking portion 12c. As a result, the vibration is less likely to be transferred from second supporting terminal 42y to circuit board 1, so as to reduce or prevent acoustic noise.

Fifth Preferred Embodiment

Hereinafter, a supporting-terminal-equipped capacitor chip according to a fifth preferred embodiment of the present invention will be described with reference to the drawings. The supporting-terminal-equipped capacitor chip according to the fifth preferred embodiment of the present invention is different from supporting-terminal-equipped capacitor chip 10 according to the first preferred embodiment of the present invention mainly in terms of the shape of each of the first supporting terminal and the second supporting terminal. Therefore, the same or similar configurations as those of the supporting-terminal-equipped capacitor chip 10 according to the first preferred embodiment of the present invention will not be repeatedly described.

Figure 17:
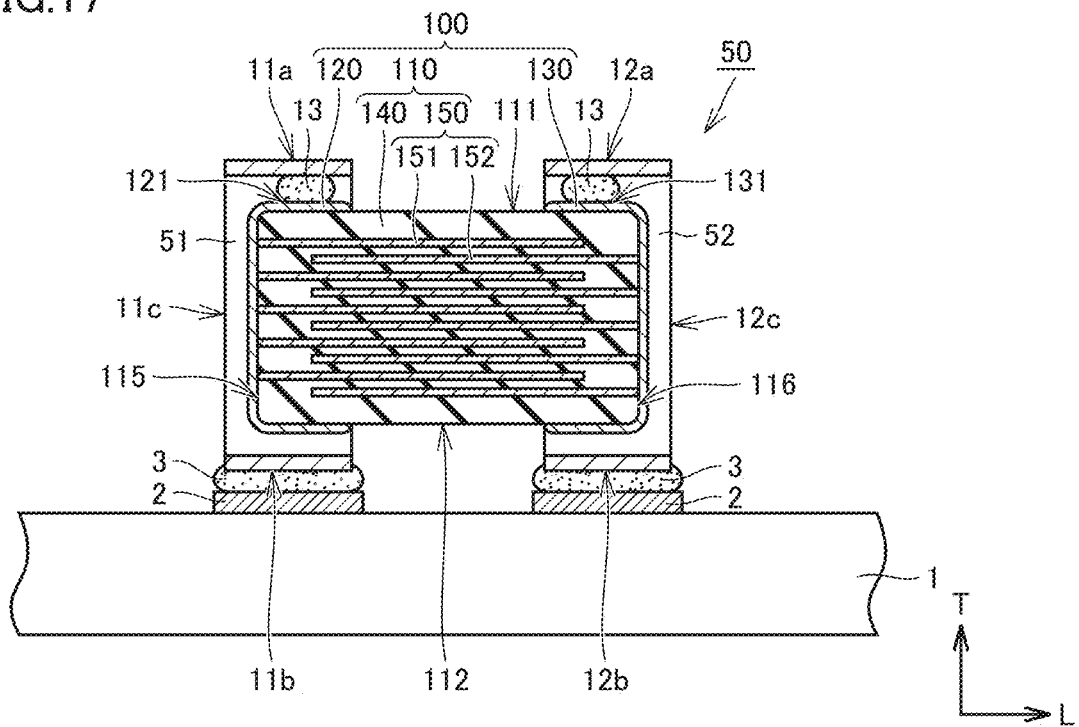
FIG. 17 is a cross sectional view showing a structure in which a supporting-terminal-equipped capacitor chip according to a fifth preferred embodiment of the present invention is mounted on a circuit board.
Figure 18:
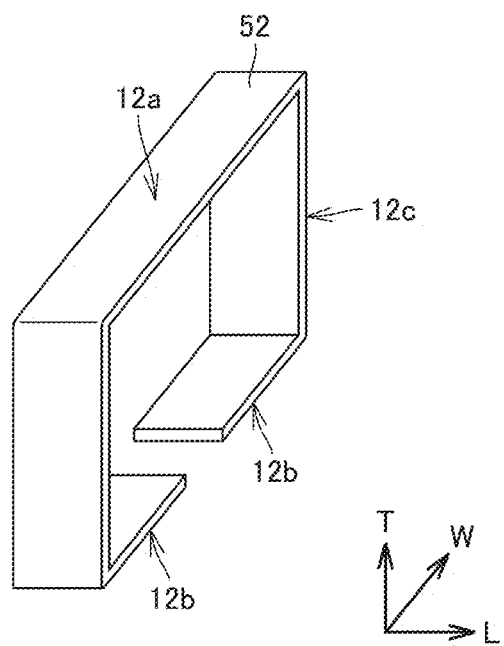
FIG. 18 is a perspective view showing a second supporting terminal included in the supporting-terminal-equipped capacitor chip according to the fifth preferred embodiment of the present invention.

FIG. 17 is a cross sectional view showing a structure in which the supporting-terminal-equipped capacitor chip according to the fifth preferred embodiment of the present invention is mounted on a circuit board. FIG. 18 is a perspective view showing an external appearance of a second supporting terminal included in the supporting-terminal-equipped capacitor chip according to the fifth preferred embodiment of the present invention. FIG. 17 shows the cross section in the same manner as in FIG. 8.

As shown in FIGS. 17 and 18, in a supporting-terminal-equipped capacitor chip 50 according to the fifth preferred embodiment of the present invention, each of a first supporting terminal 51 and a second supporting terminal 52 has a C shape or a substantially C shape when viewed in length direction L. Since the shape of first supporting terminal 51 is the same or substantially the same as that of second supporting terminal 52, only second supporting terminal 52 will be described while first supporting terminal 51 will not be repeatedly described.

Specifically, in second supporting terminal 52, second supporting portion 12a extends in width direction W, a pair of second linking portions 12c extend in layering direction T from both ends of second supporting portion 12a in the width direction, and a pair of second terminal portions 12b extend to come close to each other in width direction W from end portions of the pair of second linking portions 12c opposite to the second supporting portion 12a side. As a result, second supporting portion 12a and each of the pair of second terminal portions 12b face each other with a space being interposed therebetween.

Also in supporting-terminal-equipped capacitor chip 50 according to the fifth preferred embodiment of the present invention, the magnitude of the vibration propagated from capacitor chip 100 to each of first supporting terminal 51 and second supporting terminal 52 is reduced, and the vibration is damped when propagated through each of first supporting terminal 51 and second supporting terminal 52, such that the vibration is less likely to be transferred from each of first supporting terminal 51 and second supporting terminal 52 to circuit board 1. Accordingly, acoustic noise can be reduced or prevented.

Here, the following describes a modification in which each of first supporting terminal 51 and second supporting terminal 52 has a different shape. It should be noted that since the shape of the first supporting terminal is the same or substantially the same as that of the second supporting terminal, only the second supporting terminal will be described while the first supporting terminal will not be repeatedly described.

Figure 19:
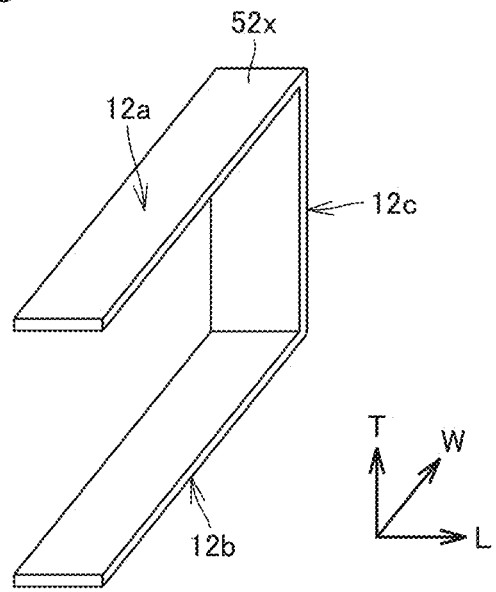
FIG. 19 is a perspective view showing a second supporting terminal included in a supporting-terminal-equipped capacitor chip according to a modification of the fifth preferred embodiment of the present invention.

FIG. 19 is a perspective view showing an external appearance of a second supporting terminal included in a supporting-terminal-equipped capacitor chip according to a modification of the fifth preferred embodiment of the present invention. As shown in FIG. 19, in a second supporting terminal 52x included in the supporting-terminal-equipped capacitor chip according to the modification of the fifth preferred embodiment of the present invention, second supporting portion 12a extends in one direction of width direction W, second linking portion 12c extends in layering direction T from one end in the width direction of second supporting portion 12a, and second terminal portion 12b extends in the other direction of width direction W from the end of second linking portion 12c opposite to the second supporting portion 12a side. As a result, second supporting portion 12a and second terminal portion 12b face each other with a space being interposed therebetween.

Thus, the elastic modulus of second linking portion 12c can be made small, thus improving vibration damping performance in second linking portion 12c. As a result, the vibration is less likely to be transferred from second supporting terminal 52x to circuit board 1, so as to reduce acoustic noise.

Sixth Preferred Embodiment

Hereinafter, a supporting-terminal-equipped capacitor chip according to a sixth preferred embodiment of the present invention will be described with reference to the drawings. The supporting-terminal-equipped capacitor chip according to the sixth preferred embodiment of the present invention is different from supporting-terminal-equipped capacitor chip 10 according to the first preferred embodiment of the present invention mainly in terms of the structure of each of the first supporting terminal and the second supporting terminal. Therefore, the same or similar configurations as those of supporting-terminal-equipped capacitor chip 10 according to the first preferred embodiment of the present invention will not be repeatedly described.

Figure 20:
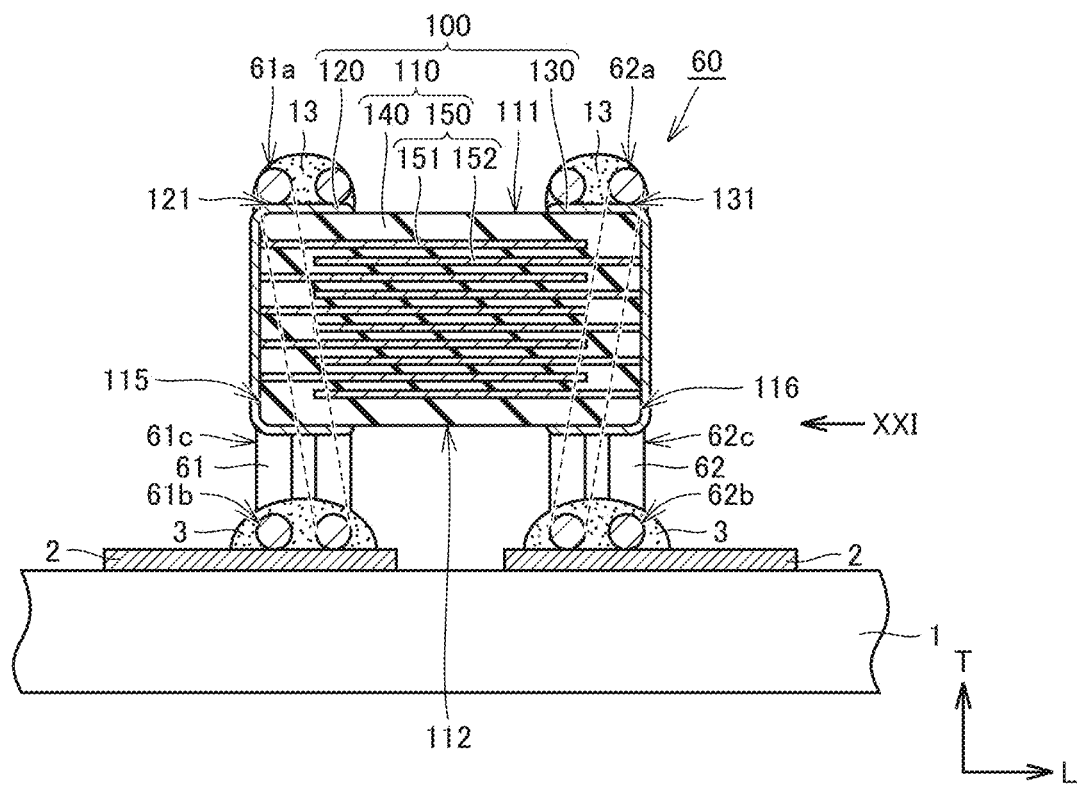
FIG. 20 is a cross sectional view showing a structure in which a supporting-terminal-equipped capacitor chip according to a sixth preferred embodiment of the present invention is mounted on a circuit board.
Figure 21:
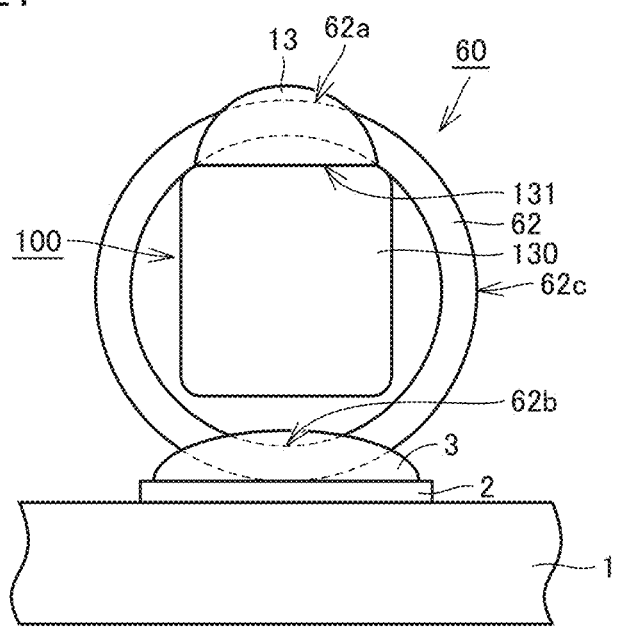
FIG. 21 is a diagram showing a structure in which the supporting-terminal-equipped capacitor chip of FIG. 20 is mounted on the circuit board when viewed in a direction of an arrow XXI.

FIG. 20 is a cross sectional view showing a structure in which the supporting-terminal-equipped capacitor chip according to the sixth preferred embodiment of the present invention is mounted on a circuit board. FIG. 21 is a diagram showing the structure in which the supporting-terminal-equipped capacitor chip of FIG. 20 is mounted on the circuit board when viewed in a direction of an arrow XXI. FIG. 20 shows the cross sectional view in the same manner as in FIG. 8.

As shown in FIGS. 20 and 21, in a supporting-terminal-equipped capacitor chip 60 according to the sixth preferred embodiment of the present invention, each of first supporting terminal 61 and second supporting terminal 62 is defined by one winding. That is, capacitor chip 100 is disposed at an inner side with respect to the two windings and is held therebetween. As shown in FIG. 21, in the present preferred embodiment, each of the windings has an annular shape when viewed in length direction L, but may have, for example, a quadrangular shape.

First supporting terminal 61 includes a first supporting portion 61a connected to first connection portion 121, a first terminal portion 61b connected to circuit board 1 on which capacitor chip 100 is mounted, and a first linking portion 61c that links first supporting portion 61a to first terminal portion 61b. First supporting portion 61a is a portion of the winding located at one end in layering direction T. First terminal portion 61b is a portion of the winding located at the other end in layering direction T. First linking portion 61c is a portion of the winding located at the center in layering direction T.

In the present preferred embodiment, in each turn of the winding, first supporting portion 61a located at one end in layering direction T is connected to first connection portion 121, and first terminal portion 61b located at the other end in layering direction T is connected to land 2. Thus, first linking portion 61c is defined by a portion of the winding with less than one turn.

Second supporting terminal 62 includes a second supporting portion 62a connected to second connection portion 131, a second terminal portion 62b connected to circuit board 1 on which capacitor chip 100 is mounted, and a second linking portion 62c that links second supporting portion 62a to second terminal portion 62b. Second supporting portion 62a is a portion of the winding located at one end in layering direction T. Second terminal portion 62b is a portion of the winding located at the other end in layering direction T. Second linking portion 62c is a portion of the winding located at the center or approximate center in layering direction T.

In the present preferred embodiment, in each turn of the winding, second supporting portion 62a located at one end in layering direction T is connected to second connection portion 131, and second terminal portion 62b located at the other end in layering direction T is connected to land 2. Thus, second linking portion 62c is defined by a portion of the winding with less than one turn.

Also in supporting-terminal-equipped capacitor chip 60 according to the sixth preferred embodiment of the present invention, the magnitude of the vibration propagated from capacitor chip 100 to each of first supporting terminal 61 and second supporting terminal 62 is reduced, and the vibration is damped when propagated through each of first supporting terminal 61 and second supporting terminal 62, such that the vibration is less likely to be transferred from each of first supporting terminal 61 and second supporting terminal 62 to circuit board 1. Accordingly, acoustic noise can be reduced or prevented.

Seventh Preferred Embodiment

Hereinafter, a supporting-terminal-equipped capacitor chip according to a seventh preferred embodiment of the present invention will be described with reference to figures. The supporting-terminal-equipped capacitor chip according to the seventh preferred embodiment of the present invention is different from supporting-terminal-equipped capacitor chip 60 according to the sixth preferred embodiment of the present invention mainly in that each of the first linking portion and the second linking portion is constituted of a portion of a winding with one or more turns. Therefore, the same or similar configurations as those of the supporting-terminal-equipped capacitor chip 60 according to the sixth preferred embodiment of the present invention will not be repeatedly described.

Figure 22:
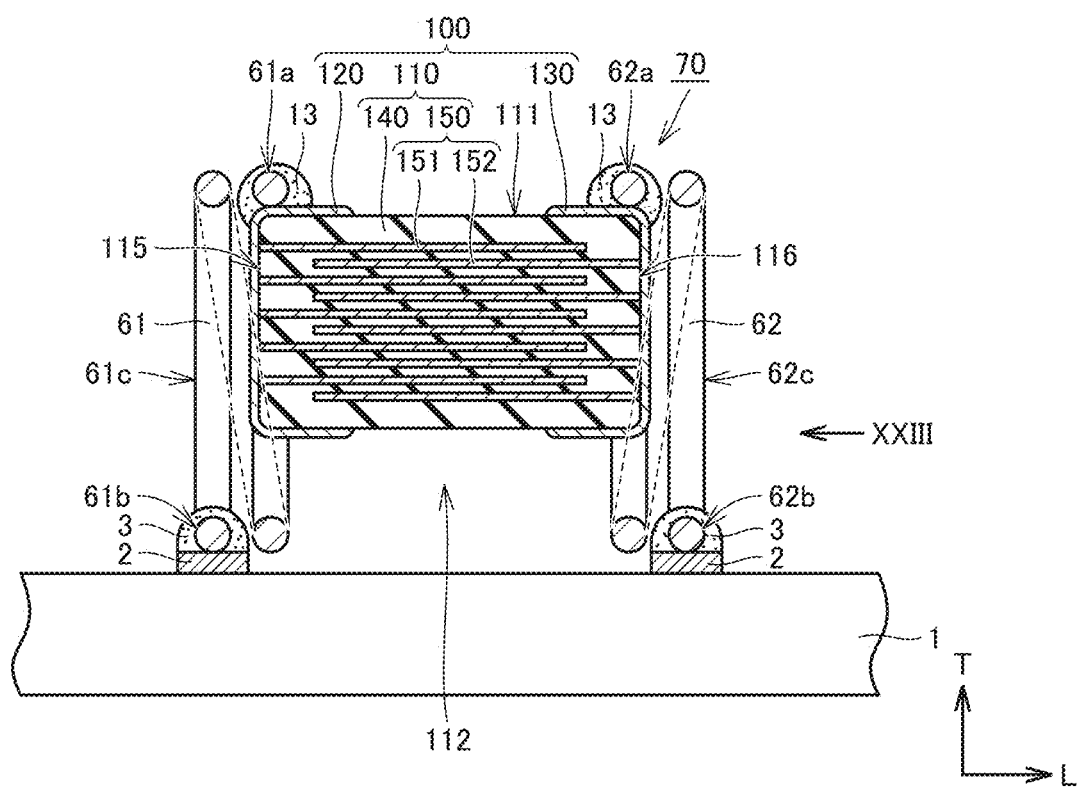
FIG. 22 is a cross sectional view showing a structure in which a supporting-terminal-equipped capacitor chip according to a seventh preferred embodiment of the present invention is mounted on a circuit board.
Figure 23:
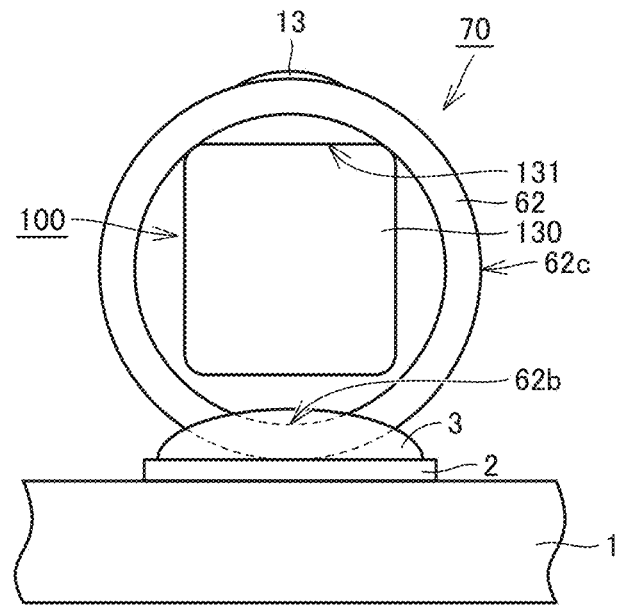
FIG. 23 is a diagram showing a structure in which the supporting-terminal-equipped capacitor chip of FIG. 22 is mounted on the circuit board when viewed in a direction of an arrow XXIII.

FIG. 22 is a cross sectional view showing a structure in which the supporting-terminal-equipped capacitor chip according to the seventh preferred embodiment of the present invention is mounted on a circuit board. FIG. 23 is a diagram showing the structure in which the supporting-terminal-equipped capacitor chip of FIG. 22 is mounted on the circuit board when viewed in a direction of an arrow XXIII. FIG. 22 shows the cross section in the same manner as in FIG. 20.

As shown in FIG. 22, in a supporting-terminal-equipped capacitor chip 70 according to the seventh preferred embodiment of the present invention, each of a first linking portion 61c and a second linking portion 62c is defined by a portion of the winding with one or more turns.

Specifically, in a turn on the one end side of the winding in a winding axis direction, first supporting portion 61a located at one end in layering direction T is connected to first connection portion 121. In a turn on the other end of the winding in the winding axis direction, first terminal portion 61b located at the other end in layering direction T is connected to land 2. As a result, first linking portion 61c is defined by a portion of the winding with one or more turns.

In a turn on the one end side of the winding in the winding axis direction, second supporting portion 62a located at one end in layering direction T is connected to second connection portion 131. In a turn on the other end of the winding in the winding axis direction, second terminal portion 62b located at the other end in layering direction T is connected to land 2. As a result, second linking portion 62c is defined by a portion of the winding with one or more turns.

Thus, the elastic modulus of each of first linking portion 61c and second linking portion 62c can be made small, thus improving vibration damping performance in each of first linking portion 61c and second linking portion 62c. As a result, the vibration is less likely to be transferred from each of first supporting terminal 61 and second supporting terminal 62 to circuit board 1, thus reducing acoustic noise.

Eighth Preferred Embodiment

Hereinafter, a supporting-terminal-equipped capacitor chip according to an eighth preferred embodiment of the present invention will be described with reference to the drawings. The supporting-terminal-equipped capacitor chip according to the eighth preferred embodiment of the present invention is different from supporting-terminal-equipped capacitor chip 10 according to the first preferred embodiment of the present invention mainly in terms of the positions of the first connection portion and the second connection portion in the capacitor chip. Therefore, the same or similar configurations as those of supporting-terminal-equipped capacitor chip 10 according to the first preferred embodiment of the present invention will not be repeatedly described.

Figure 24:
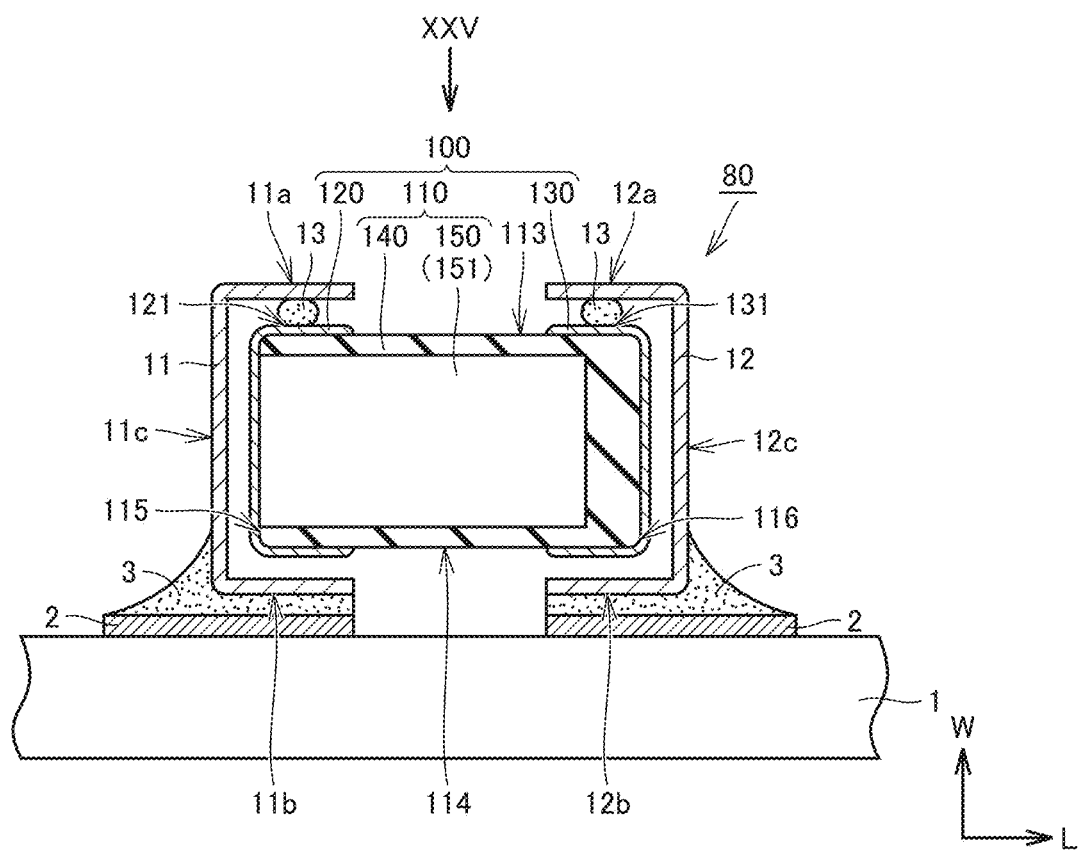
FIG. 24 is a cross sectional view showing a structure in which a supporting-terminal-equipped capacitor chip according to an eighth preferred embodiment of the present invention is mounted on a circuit board.
Figure 25:
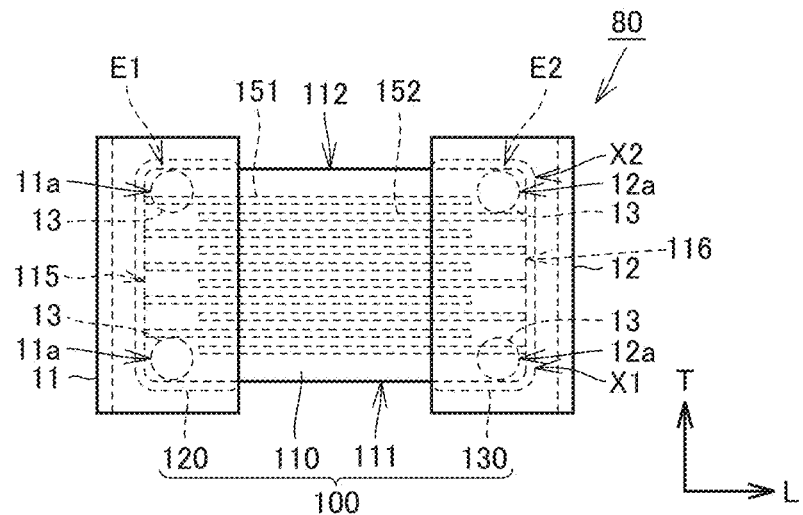
FIG. 25 is a plan view showing the supporting-terminal-equipped capacitor chip of FIG. 24 when viewed in the direction of an arrow XXV.
Figure 26:
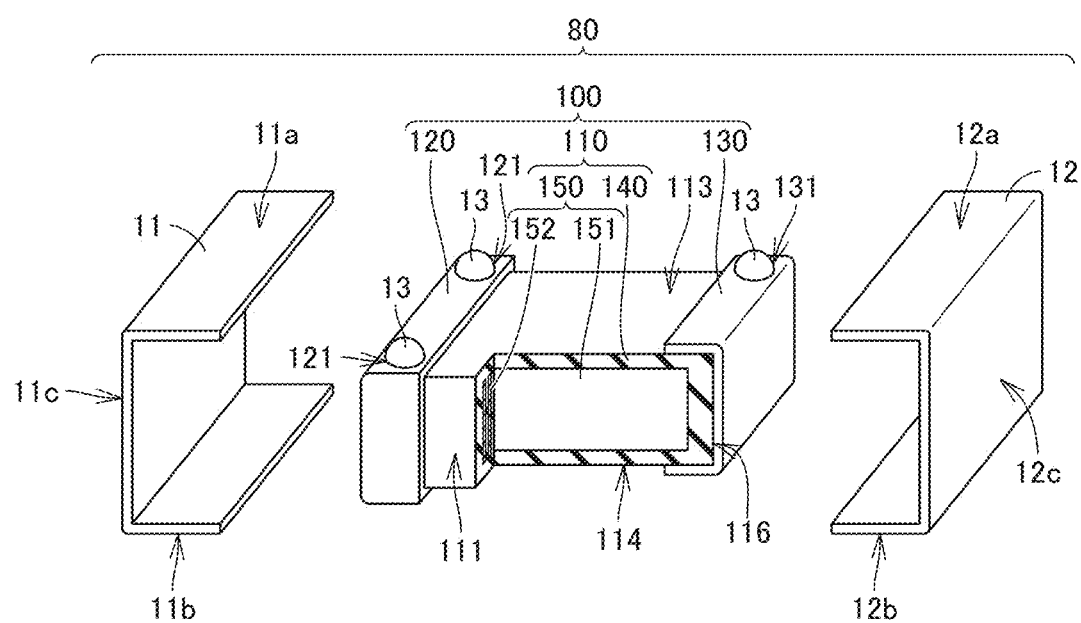
FIG. 26 is an exploded perspective view showing a configuration of the supporting-terminal-equipped capacitor chip according to the eighth preferred embodiment of the present invention.

FIG. 24 is a cross sectional view showing a structure in which the supporting-terminal-equipped capacitor chip according to the eighth preferred embodiment of the present invention is mounted on a circuit board. FIG. 25 is a plan view showing the supporting-terminal-equipped capacitor chip of FIG. 24 when viewed in a direction of an arrow XXV. FIG. 26 is an exploded perspective view showing a configuration of the supporting-terminal-equipped capacitor chip according to the eighth preferred embodiment of the present invention. FIG. 24 shows the cross sectional in the same manner as in FIG. 20.

As shown in FIGS. 24 to 26, in a supporting-terminal-equipped capacitor chip 80 according to the eighth preferred embodiment of the present invention, first supporting terminal 11 is connected to first connection portion 121 of first outer electrode 120 located on first side surface 113, and second supporting terminal 12 is connected to second connection portion 131 of second outer electrode 130 located on first side surface 113.

As shown in FIGS. 25 and 26, first connection portion 121 is located on first side surface 113 so as to be adjacent to at least one of first main surface 111 and second main surface 112. In the present preferred embodiment, first connection portion 121 is located on first side surface 113 so as to be adjacent to both first main surface 111 and second main surface 112. That is, first connection portion 121 is provided at each of two portions.

As shown in FIG. 25, at least a portion of first connection portion 121 overlies at least one of first outer layer portion X1 and second outer layer portion X2 when viewed in the width direction W. In the present preferred embodiment, first connection portion 121 at one of the two portions overlies first outer layer portion X1 when viewed in width direction W, and first connection portion 121 at the other of the two portions overlies second outer layer portion X2 when viewed in width direction W. Further, first connection portion 121 overlies first end margin portion E1 when viewed in width direction W. In multilayer body 110, first connection portion 121 is located at a position at which relatively small strain is caused when voltage is applied as shown in FIG. 6.

As shown in FIGS. 25 and 26, second connection portion 131 is located on first side surface 113 so as to be adjacent to at least one of first main surface 111 and second main surface 112. In the present preferred embodiment, second connection portion 131 is located on first side surface 113 so as to be adjacent to both first main surface 111 and second main surface 112. That is, second connection portion 131 is provided at each of two portions.

At least a portion of second connection portion 131 overlies at least one of first outer layer portion X1 and second outer layer portion X2 when viewed in width direction W. In the present preferred embodiment, second connection portion 131 at one of the two portions overlies first outer layer portion X1 when viewed in width direction W, and second connection portion 131 at the other of the two portions overlies second outer layer portion X2 when viewed in width direction W. Further, second connection portion 131 overlies second end margin portion E2 when viewed in width direction W. In multilayer body 110, second connection portion 131 is located at a position at which relatively small strain is caused when voltage is applied as shown in FIG. 6.

In supporting-terminal-equipped capacitor chip 80 according to the eighth preferred embodiment of the present invention, each of first connection portion 121 and second connection portion 131 is located on first side surface 113 so as to be adjacent to at least one of first main surface 111 and second main surface 112.

Thus, since first connection portion 121 and second connection portion 131 are located at positions at each of which relatively small strain is caused when voltage is applied to capacitor chip 100, the magnitude of the vibration propagated from capacitor chip 100 to first supporting terminal 11 and second supporting terminal 12 can be reduced.

In supporting-terminal-equipped capacitor chip 80 according to the eighth preferred embodiment of the present invention, at least a portion of each of first connection portion 121 and second connection portion 131 overlies at least one of first outer layer portion X1 and second outer layer portion X2 when viewed in width direction W.

Each of first outer layer portion X1 and second outer layer portion X2 is a position at which a piezoelectric phenomenon is less likely to occur as compared with inner layer portion C. Therefore, since at least a portion of each of first connection portion 121 and second connection portion 131 overlies at least one of first outer layer portion X1 and second outer layer portion X2 when viewed in width direction W, the magnitude of the vibration propagated from capacitor chip 100 to first supporting terminal 11 and second supporting terminal 12 can be reduced.

As described above, in supporting-terminal-equipped capacitor chip 80 according to the eighth preferred embodiment of the present invention, the magnitude of the vibration propagated from capacitor chip 100 to each of first supporting terminal 11 and second supporting terminal 12 is reduced, and the vibration is damped when propagated through each of first supporting terminal 11 and second supporting terminal 12, thus the vibration is less likely to be transferred from each of first supporting terminal 11 and second supporting terminal 12 to circuit board 1. Accordingly, acoustic noise can be reduced or prevented.

In the description of the preferred embodiments described above, configurations that can be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A supporting-terminal-equipped capacitor chip comprising:
    a capacitor chip; and
    a first supporting terminal and a second supporting terminal that hold the capacitor chip between the first supporting terminal and the second supporting terminal, the first supporting terminal and the second supporting terminal being electrically conductive; wherein
    the capacitor chip includes:
        a multilayer body including a plurality of dielectric layers and a plurality of inner electrode layers alternately layered along a layering direction, a first main surface and a second main surface facing each other in the layering direction, a first side surface and a second side surface facing each other in a width direction orthogonal or substantially orthogonal to the layering direction, and a first end surface and a second end surface facing each other in a length direction orthogonal or substantially orthogonal to both the layering direction and the width direction;
        a first outer electrode extending from the first end surface onto a portion of each of the first main surface and the second main surface adjacent to the first end surface; and
        a second outer electrode extending from the second end surface onto a portion of each of the first main surface and the second main surface adjacent to the second end surface;
    the plurality of inner electrode layers include a first inner electrode layer connected to the first outer electrode and a second inner electrode layer connected to the second outer electrode;
    the first supporting terminal is connected to a first connection portion of the first outer electrode on the first main surface;
    the second supporting terminal is connected to a second connection portion of the second outer electrode on the first main surface;
    a portion of the capacitor chip other than the first connection portion and the first supporting terminal are separated from each other;
    a portion of the capacitor chip other than the second connection portion and the second supporting terminal are separated from each other; and
    the first connection portion and the second connection portion are located on the first main surface each at positions that place at least one side of the first and second connection portions to overlap the corresponding first or second end surface in the stacking direction without extending past the corresponding first or second end surface.

2. The supporting-terminal-equipped capacitor chip according to claim 1, wherein
    the multilayer body includes an inner layer portion having a capacitance with facing portions of the first inner electrode layer and the second inner electrode layer being layered in the layering direction, a first end margin portion located on a first end surface side of the inner layer portion in the length direction, and a second end margin portion located on a second end surface side of the inner layer portion in the length direction;
    at least a portion of the first connection portion overlies the first end margin portion when viewed in the layering direction; and
    at least a portion of the second connection portion overlies the second end margin portion when viewed in the layering direction.

3. The supporting-terminal-equipped capacitor chip according to claim 1, wherein
    the first supporting terminal includes:
        a first supporting portion connected to the first connection portion;
        a first terminal portion connected to a substrate on which the capacitor chip is mounted; and
        a first linking portion that links the first supporting portion to the first terminal portion;
    the second supporting terminal includes:
        a second supporting portion connected to the second connection portion;
        a second terminal portion connected to the substrate on which the capacitor chip is mounted; and a second linking portion that links the second supporting portion to the second terminal portion.

4. The supporting-terminal-equipped capacitor chip according to claim 3, wherein
the first supporting portion and the first terminal portion face each other with a space being interposed between the first supporting portion and the first terminal portion; and
the second supporting portion and the second terminal portion face each other with a space being interposed between the second supporting portion and the second terminal portion.

5. The supporting-terminal-equipped capacitor chip according to claim 3, wherein each of the first supporting terminal and the second supporting terminal is defined by one winding.

6. The supporting-terminal-equipped capacitor chip according to claim 5, wherein each of the first linking portion and the second linking portion is defined by a portion of the winding with one or more turns.

7. The supporting-terminal-equipped capacitor chip according to claim 1, wherein each of the first supporting terminal and the second supporting terminal is defined by one bent metal thin plate.

8. The supporting-terminal-equipped capacitor chip according to claim 1, wherein each of the first and second supporting terminals has a C shape or a substantially C shape.

9. The supporting-terminal-equipped capacitor chip according to claim 1, wherein each of the first and second supporting terminals has an L or substantially L shape.

10. The supporting-terminal-equipped capacitor chip according to claim 1, wherein each of the first and second supporting terminals has an S shape or a substantially S shape.

11. A supporting-terminal-equipped capacitor chip comprising:
a capacitor chip; and
a first supporting terminal and a second supporting terminal that holds the capacitor chip between the first supporting terminal and the second supporting terminal, the first supporting terminal and the second supporting terminal being electrically conductive; wherein
the capacitor chip includes:
a multilayer body including a plurality of dielectric layers and a plurality of inner electrode layers alternately layered along a layering direction, a first main surface and a second main surface facing each other in the layering direction, a first side surface and a second side surface facing each other in a width direction orthogonal or substantially orthogonal to the layering direction, and a first end surface and a second end surface facing each other in a length direction orthogonal or substantially orthogonal to both the layering direction and the width direction;
a first outer electrode extending from the first end surface onto a portion of each of the first side surface and the second side surface adjacent to the first end surface; and
a second outer electrode extending from the second end surface onto a portion of each of the first side surface and the second side surface adjacent to the second end surface;
the plurality of inner electrode layers include a first inner electrode layer connected to the first outer electrode and a second inner electrode layer connected to the second outer electrode;

the first supporting terminal is connected to a first connection portion of the first outer electrode on the first side surface;
the second supporting terminal is connected to a second connection portion of the second outer electrode on the first side surface;
a portion of the capacitor chip other than the first connection portion and the first supporting terminal are separated from each other;
a portion of the capacitor chip other than the second connection portion and the second supporting terminal are separated from each other; and
the first connection portion and the second connection portion are located on the first side surface each at positions that place at least one side of the first and second connection portions to overlap the corresponding first or second end surface in the width direction without extending past the corresponding first or second end surface.

12. The supporting-terminal-equipped capacitor chip according to claim 11, wherein
the multilayer body includes an inner layer portion having a capacitance with facing portions of the first inner electrode layer and the second inner electrode layer being layered in the layering direction, a first outer layer portion located on a first main surface side of the inner layer portion in the layering direction, and a second outer layer portion located on a second main surface side of the inner layer portion in the layering direction;
at least a portion of the first connection portion overlies at least one of the first outer layer portion and the second outer layer portion when viewed in the width direction; and
at least a portion of the second connection portion overlies at least one of the first outer layer portion and the second outer layer portion when viewed in the width direction.

13. The supporting-terminal-equipped capacitor chip according to claim 11, wherein
the first supporting terminal includes:
a first supporting portion connected to the first connection portion;
a first terminal portion connected to a substrate on which the capacitor chip is mounted; and
a first linking portion that links the first supporting portion to the first terminal portion;
the second supporting terminal includes:
a second supporting portion connected to the second connection portion;
a second terminal portion connected to the substrate on which the capacitor chip is mounted; and
a second linking portion that links the second supporting portion to the second terminal portion.

14. The supporting-terminal-equipped capacitor chip according to claim 13, wherein
the first supporting portion and the first terminal portion face each other with a space being interposed between the first supporting portion and the first terminal portion; and
the second supporting portion and the second terminal portion face each other with a space being interposed between the second supporting portion and the second terminal portion.

15. The supporting-terminal-equipped capacitor chip according to claim 13, wherein each of the first supporting terminal and the second supporting terminal is defined by one winding.

16. The supporting-terminal-equipped capacitor chip according to claim 15, wherein each of the first linking portion and the second linking portion is defined by a portion of the winding with one or more turns.

17. The supporting-terminal-equipped capacitor chip according to claim 11, wherein each of the first supporting terminal and the second supporting terminal is defined by one bent metal thin plate.

18. The supporting-terminal-equipped capacitor chip according to claim 11, wherein each of the first and second supporting terminals has a C shape or a substantially C shape.

19. The supporting-terminal-equipped capacitor chip according to claim 11, wherein each of the first and second supporting terminals has an L shape or a substantially L shape.

20. The supporting-terminal-equipped capacitor chip according to claim 11, wherein each of the first and second supporting terminals has an S shape or a substantially S shape.

* * * * *